(12) United States Patent
Ren et al.

(10) Patent No.: US 12,211,669 B2
(45) Date of Patent: Jan. 28, 2025

(54) MULTIPLE CHARGED-PARTICLE BEAM APPARATUS WITH LOW CROSSTALK

(71) Applicant: ASML Netherlands B.V., Veldhoven (NL)

(72) Inventors: Weiming Ren, San Jose, CA (US);
Zizhou Gong, San Jose, CA (US);
Xuerang Hu, San Jose, CA (US);
Xuedong Liu, San Jose, CA (US);
Zhong-wei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 458 days.

(21) Appl. No.: 17/127,956

(22) Filed: Dec. 18, 2020

(65) Prior Publication Data
US 2021/0193437 A1 Jun. 24, 2021

Related U.S. Application Data

(60) Provisional application No. 62/950,774, filed on Dec. 19, 2019.

(51) Int. Cl.
*H01J 37/317* (2006.01)
*H01J 37/141* (2006.01)
(Continued)

(52) U.S. Cl.
CPC ........ *H01J 37/3177* (2013.01); *H01J 37/141* (2013.01); *H01J 37/1474* (2013.01);
(Continued)

(58) Field of Classification Search
CPC ........ H01J 37/00; H01J 37/02; H01J 37/3177; H01J 37/141; H01J 37/1474; H01J 37/20;
(Continued)

(56) References Cited

U.S. PATENT DOCUMENTS

| 2002/0033449 A1 | 3/2002 | Nakasuji et al. |
| 2016/0133435 A1* | 5/2016 | Frosien ................. H01J 37/05 250/397 |

(Continued)

FOREIGN PATENT DOCUMENTS

| JP | 2002-157969 A | 5/2002 |
| JP | 2011-192498 A | 9/2011 |

(Continued)

OTHER PUBLICATIONS

Notice of Reasons for Rejection issued by the Japan Patent Office in related Japanese Patent Application No. 2022-532841; mailed Jul. 4, 2023 (11 pgs.).

*Primary Examiner* — Jason L McCormack
(74) *Attorney, Agent, or Firm* — Finnegan, Henderson, Farabow, Garrett & Dunner, LLP

(57) ABSTRACT

Systems and methods of forming images of a sample using a multi-beam apparatus are disclosed. The method may include generating a plurality of secondary electron beams from a plurality of probe spots on the sample upon interaction with a plurality of primary electron beams. The method may further include adjusting an orientation of the plurality of primary electron beams interacting with the sample, directing the plurality of secondary electron beams away from the plurality of primary electron beams, compensating astigmatism aberrations of the plurality of directed secondary electron beams, focusing the plurality of directed secondary electron beams onto a focus plane, detecting the plurality of focused secondary electron beams by a charged-particle detector, and positioning a detection plane of the charged-particle detector at or close to the focus plane.

17 Claims, 12 Drawing Sheets

(51) Int. Cl.
*H01J 37/147* (2006.01)
*H01J 37/20* (2006.01)
*H01J 37/244* (2006.01)
*H01J 37/28* (2006.01)

(52) U.S. Cl.
CPC ............ *H01J 37/20* (2013.01); *H01J 37/244* (2013.01); *H01J 37/28* (2013.01); *H01J 2237/049* (2013.01); *H01J 2237/1532* (2013.01); *H01J 2237/20207* (2013.01); *H01J 2237/2446* (2013.01); *H01J 2237/2448* (2013.01)

(58) Field of Classification Search
CPC ........ H01J 37/244; H01J 37/28; H01J 37/153; H01J 37/292; H01J 2237/049; H01J 2237/1532; H01J 2237/20207; H01J 2237/2446; H01J 2237/2448; H01J 2237/2813; H01J 2237/24592; H01J 2237/151; H01J 2237/1501; H01J 2237/1205; H01J 2237/0453; H01J 2237/0435; H01J 2237/2806
USPC ......................................... 250/306, 307, 311
See application file for complete search history.

(56) References Cited

U.S. PATENT DOCUMENTS

| | | |
|---|---|---|
| 2016/0284505 A1 | 9/2016 | Ren et al. |
| 2017/0025243 A1 | 1/2017 | Ren et al. |
| 2017/0154756 A1 | 6/2017 | Ren et al. |
| 2019/0355545 A1* | 11/2019 | Zeidler .................. H01J 37/21 |

FOREIGN PATENT DOCUMENTS

| | | |
|---|---|---|
| JP | 2018-535525 A | 11/2018 |
| KR | 2018-0097597 A | 8/2018 |
| WO | WO 200201597 A1 | 1/2002 |
| WO | WO 2018/122176 A1 | 7/2018 |

* cited by examiner

MULTIPLE CHARGED-PARTICLE BEAM APPARATUS WITH LOW CROSSTALK

CROSS-REFERENCE TO RELATED APPLICATIONS

This application claims priority of U.S. application 62/950,774 which was filed on Dec. 19, 2019, and which is incorporated herein in its entirety by reference.

TECHNICAL FIELD

The embodiments provided herein disclose a multi-beam apparatus, and more particularly a multi-beam charged particle microscope with enhanced inspection throughput by reducing crosstalk between detection elements of a charged-particle detector.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more important. Although multiple electron beams may be used to increase the throughput, the crosstalk between detection elements of a secondary electron detector may limit the throughput desired, rendering the inspection tools inadequate for their desired purpose.

SUMMARY

One aspect of the present disclosure is directed to a method performed by a multi-beam apparatus to form images of a sample. The method may comprise generating a plurality of secondary electron beams from a plurality of probe spots on the sample along a primary-optical axis upon interaction with a plurality of primary electron beams. The method may further comprise focusing the plurality of secondary electron beams on a focus plane, and positioning a detection surface of a secondary electron detector with respect to the focus plane. The plurality of secondary electron beams may comprise an array of secondary electron beams.

The method may further comprise adjusting an orientation of the plurality of primary electron beams interacting with the sample, wherein adjusting the orientation of the plurality of primary electron beams comprises rotating the plurality of primary electron beams around the primary optical axis, and may adjust an orientation of the array of secondary electron beams. The method may further comprise directing, using a beam separator, the plurality of secondary electron beams towards the secondary electron detector along a secondary optical axis. The method may further comprise adjusting an electrical excitation of a stigmator to compensate astigmatism aberration of the plurality of secondary electron beams.

The secondary electron detector may be disposed downstream of a secondary electron projection system configured to focus the plurality of secondary electron beams on the focus plane, wherein the secondary electron detector comprises a plurality of detection elements, and wherein a detection element of the plurality of detection elements is associated with a corresponding secondary electron beam of the plurality of secondary electron beams. Positioning the detection surface of the secondary electron detector may comprise adjusting a tilting angle between the detection surface and the focus plane, wherein adjusting the tilting angle may comprise reducing the tilting angle between the detection surface of the secondary electron detector and the focus plane. Reducing the tilting angle may comprise adjusting the position of the secondary electron detector such that the detection surface of the secondary electron detector substantially coincides with the focus plane.

Adjusting the position of the secondary electron detector may comprise dynamically adjusting the tilting angle based on a collection efficiency of the secondary electron detector or adjusting the tilting angle to a predetermined value of the tilting angle. Adjusting the position of the secondary electron detector may comprise adjusting the tilting angle in one or more planes with reference to the secondary optical axis.

Another aspect of the present disclosure is directed to a method performed by a multi charged-particle beam apparatus to form images of a sample. The method may comprise generating a plurality of secondary electron beams from a plurality of probe spots on the sample along a primary optical axis upon interaction with a plurality of primary electron beams, adjusting an orientation of the plurality of primary electron beams interacting with the sample, forming images of the plurality of probe spots of the sample on a final image plane; and adjusting a position of a secondary electron detector with reference to a position of the final image plane.

Another aspect of the present disclosure is directed to a multi-beam apparatus for inspecting a sample using a plurality of primary electron beams configured to form a plurality of probe spots on the sample. The multi-beam apparatus may include a secondary electron projection system. The secondary electron projection system may be configured to receive a plurality of secondary electron beams resulting from the formation of the probe spots, form images of the plurality of probe spots on the sample on a final image plane, and a charged-particle detector configured to detect the plurality of secondary electron beams, wherein a position of the charged-particle detector is set based on a position of the final image plane.

The plurality of secondary electron beams may comprise an array of secondary electron beams. The multi-beam apparatus may include an objective lens configured to focus the plurality of primary electron beams on the sample and form images of the plurality of probe spots on an intermediate image plane along a primary optical axis. The multi-beam apparatus may further include a beam separator configured to direct the plurality of secondary electron beams towards the charged-particle detector along the secondary optical axis. The multi-beam apparatus may further comprise a stigmator configured to compensate astigmatism aberration of the plurality of secondary electron beams. The charged-particle detector may comprise a secondary electron detector disposed downstream of the secondary electron projection system and may comprise a plurality of detection elements, and wherein a detection element of the plurality of detection elements is associated with a corresponding secondary electron beam of the plurality of secondary electron beams.

A setting of a position of the secondary electron detector may comprise an adjusted tilting angle between a detection plane of the secondary electron detector and the final image plane. The setting of the position of the secondary electron detector may comprise a reduced tilting angle between the detection plane and the final image plane and wherein the reduced tilting angle comprises the setting of the position of the secondary electron detector such that the detection plane substantially coincides with the final image plane. The setting of the position of the secondary electron detector may comprise a dynamically adjusted tilted angle based on a collection efficiency of the secondary electron detector or the setting of the position of the secondary electron detector may comprise a predetermined value of the tilting angle. The final image plane may comprise a curved plane.

Another aspect of the present disclosure is directed to a multi-beam apparatus comprising a secondary electron projection system comprising a stigmator configured to influence paths of a plurality of secondary electron beams generated from a plurality of probe spots on a sample; and a secondary electron detector configured to detect the plurality of secondary electron beams, wherein a position of the secondary electron detector is adjusted in relation with reference to a secondary optical axis based on a position of a final image plane of the plurality of probe spots. The stigmator may comprise an electrical or a magnetic multipole lens.

Another aspect of the present disclosure is directed to a non-transitory computer readable medium storing a set of instructions that is executable by one or more processors of a multi-beam apparatus to cause the multi-beam apparatus to perform a method of forming images of a sample. The method may comprise generating a plurality of secondary electron beams from a plurality of probe spots of a plurality of primary electron beams on the sample along a primary optical axis, acquiring images of the plurality of probe spots of the sample on a final image plane using a secondary electron detector, and adjusting a position of the secondary electron detector based on a position of the final image plane. The apparatus may further perform forming an intermediate image of the plurality of probe spots on an intermediate image plane substantially perpendicular to a primary optical axis using an objective lens, and directing the plurality of secondary electron beams towards the secondary electron detector along the secondary optical axis using a beam separator. The multi-beam apparatus may further perform adjusting an orientation of the plurality of primary electron beams interacting with the sample, wherein adjusting the orientation of the plurality of primary electron beams may comprise rotating the plurality of primary electron beams around the primary optical axis, and adjusting a tilting angle between a detection plane of the secondary electron detector and the final image plane. The multi-beam apparatus may further perform adjusting an electrical excitation of a stigmator to compensate astigmatism aberration of the plurality of secondary electron beams.

Other advantages of the embodiments of the present disclosure will become apparent from the following description taken in conjunction with the accompanying drawings wherein are set forth, by way of illustration and example, certain embodiments of the present invention.

DETAILED DESCRIPTION

Figure 1:
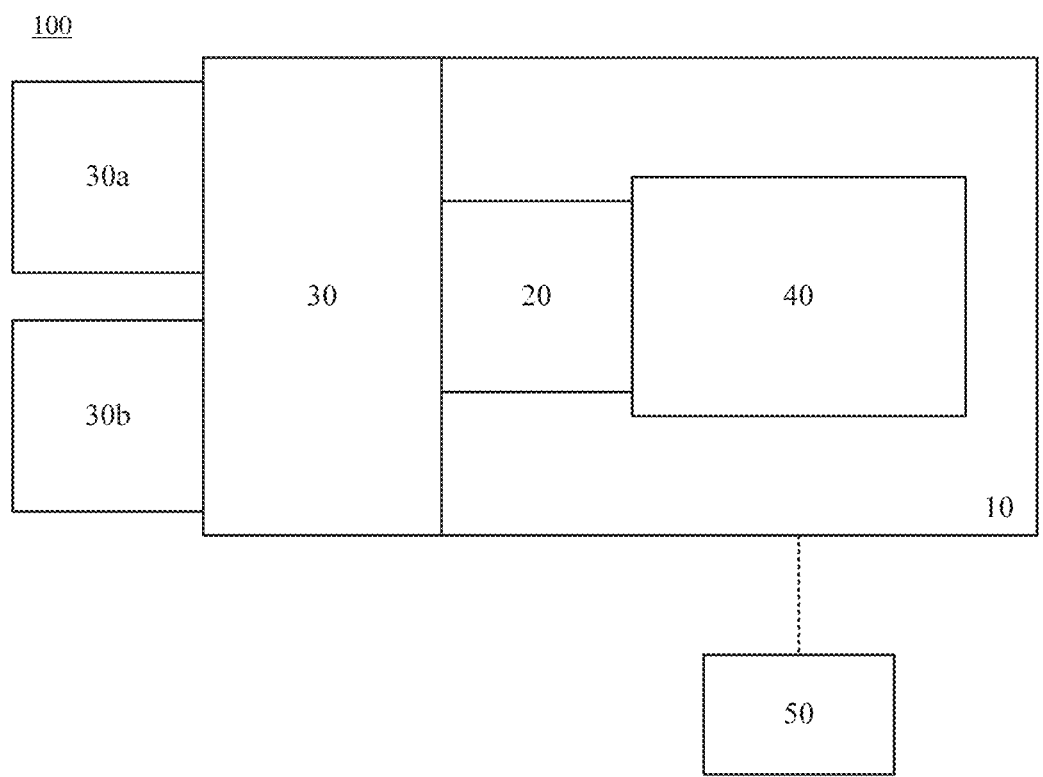
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC, thereby rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

Although a multiple charged-beam particle imaging system, such as a multi-beam SEM, may seemingly offer the advantage of high wafer inspection throughput, it may encounter several challenges related to focusing secondary electron beams generating from the sample. Because defocused beams have a larger cross-section and a larger footprint on the detection elements compared to focused beams, each of the multiple detection elements may receive secondary electrons from a corresponding secondary electron beam and other adjacent beams. Consequently, the imaging signal of one detection element may comprise a main component originating from the corresponding secondary electron beam and a crosstalk component originating from adjacent electron beams. The crosstalk component, among other things, may deteriorate the fidelity of the imaging signal, and therefore, negatively impact the inspection throughput as well as the resolution.

To mitigate the occurrence of crosstalk, an aperture mechanism may be employed in a secondary imaging system to block off peripheral secondary electrons, or the size of the detection elements may be reduced, among other things. However, blocking off peripheral electrons or reducing the size of the detection elements may reduce the total number of electrons incident on the electron detector, and therefore may negatively impact the collection efficiency, inspection throughput, or inspection resolution.

In currently existing multi-beam SEMs, although a beam separator such as a Wien filter may isolate primary and secondary electrons, it may defocus secondary electron beams (astigmatism aberration) and may also deform the secondary electron beam array, both resulting in occurrence of crosstalk, among other things. One of the several ways to mitigate the occurrence of crosstalk may include using one or more stigmators to compensate the beam astigmatism and beam array deformation. However, such a configuration may render the secondary projection system very complicated to operate and maintain, thereby adversely affecting the inspection throughput. In addition, the focus plane of secondary electron beams may not align with the detection plane of the electron detectors, causing the secondary electron beams to further defocus on the detection plane and induce crosstalk. Therefore, it may be desirable to compensate the beam astigmatism and adjust the position of electron detectors by a mechanism that allows alignment of the electron detectors with the focus plane of secondary electron beams.

Some embodiments of the present disclosure are directed to systems and methods of forming an image of a sample. The method may include generating secondary electron beams from probe spots formed by interaction of primary electron beams with regions of the sample. The generated secondary electron beams may pass through a beam separator configured to deflect the secondary electron beams towards an electron detection device. The deflection of the beam separator may cause astigmatism aberration of the secondary electron beams. The method may include compensating the astigmatism aberration by adjusting an electrical excitation of a stigmator configured to apply a correcting magnetic field or a correcting electrical field to the secondary electron beams. The method may further include forming an image of the probe spots on an image plane downstream of the stigmator and adjusting a position of the electron detector based on a position of the image plane. The ability to adjust the position of the electron detector may allow a user to focus the secondary electron beams on the detection surface of the detector, thereby minimizing the crosstalk, increasing detection efficiency, and therefore maintaining high inspection throughput.

Relative dimensions of components in drawings may be exaggerated for clarity. Within the following description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 100 consistent with embodiments of the present disclosure. As shown in FIG. 1, charged particle beam inspection system 100 includes a main chamber 10, a load-lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30*a* and a second loading port 30*b*. EFEM 30 may include additional loading port(s). First loading port 30*a* and second loading port 30*b* receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load-lock chamber 20.

Load-lock chamber 20 is connected to a load/lock vacuum pump system (not shown), which removes gas molecules in load-lock chamber 20 to reach a first pressure below the atmospheric pressure. After reaching the first pressure, one or more robot arms (not shown) transport the wafer from load-lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool. In other embodiments, electron beam tool 40 may comprise a multi-beam inspection tool.

Controller 50 may be electronically connected to electron beam tool 40 and may be electronically connected to other components as well. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load-lock chamber 20, and EFEM 30, it is appreciated that controller 50 can be part of the structure.

While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
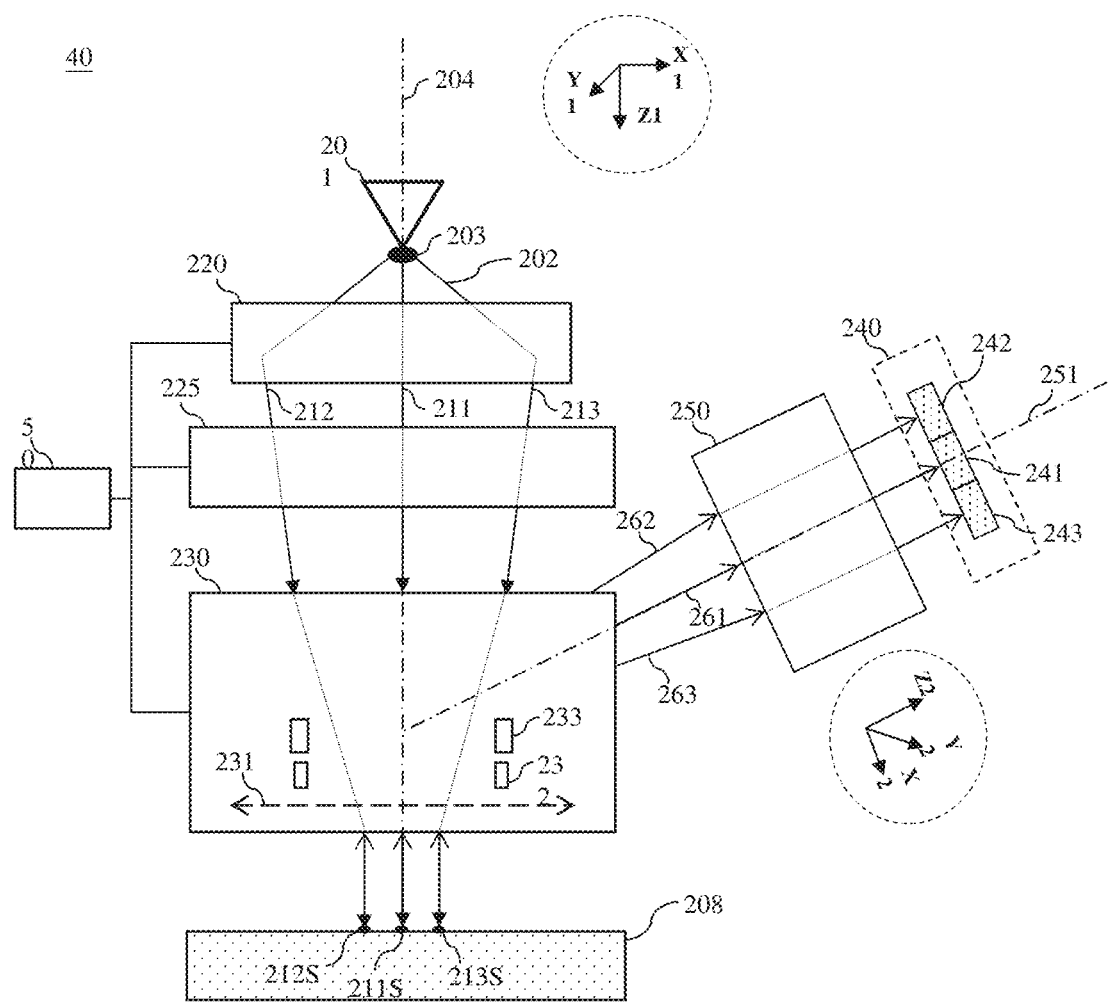
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram of an exemplary electron beam tool 40 that can be a part of the exemplary charged particle beam inspection system 100 of FIG. 1, consistent with embodiments of the present disclosure. Electron beam tool 40 (also referred to herein as apparatus 40) may comprise an electron source 201, a source conversion unit 220, a primary projection optical system 230, a secondary projection imaging system 250, and an electron detection device 240. It may be appreciated that other commonly known components of apparatus 40 may be added/omitted as appropriate.

Although not shown in FIG. 2, in some embodiments, electron beam tool 40 may comprise a gun aperture plate, a pre-beamlet forming mechanism, a condenser lens, a motorized sample stage, a sample holder to hold a sample (e.g., a wafer or a photomask).

Electron source 201, source conversion unit 220, deflection scanning unit 232, beam separator 233, and primary projection optical system 230 may be aligned with a primary optical axis 204 of apparatus 40. Secondary projection imaging system 250 and electron detection device 240 may be aligned with a secondary optical axis 251 of apparatus 40.

Electron source 201 may include a cathode, an extractor or an anode, wherein primary electrons can be emitted from the cathode and extracted or accelerated to form a primary electron beam 202 that forms a primary beam crossover (virtual or real) 203. Primary electron beam 202 can be visualized as being emitted from primary beam crossover 203.

In some embodiments, source conversion unit 220 may be configured to form a plurality of images of crossover 203 by influencing a plurality of beamlets of primary electron beam 202 (such as primary beamlets 211, 212, and 213). Source conversion unit 220 may comprise a beam-limit aperture array and a deflector array. The beam-limit aperture array may form primary beamlets 211, 212, and 213, and the deflector array may be configured to deflect the primary beamlets to form a plurality of images of crossover 203. In some embodiments, source conversion unit 220 may comprise an aperture lens array, a beam-limit aperture array, and an imaging lens. The aperture lens array may comprise an aperture-lens forming electrode plate and an aperture lens plate positioned below the aperture-lens forming electrode plate. In this context, "below" refers to the structural arrangement such that primary electron beam 202 traveling downstream from electron source 201 irradiates the aperture-lens forming electrode plate before the aperture lens plate. The aperture-lens forming electrode plate may be implemented via a plate having an aperture configured to allow at least a portion of primary electron beam 202 to pass through. The aperture lens plate may be implemented via a plate having a plurality of apertures traversed by primary electron beam 202 or multiple plates having plurality of apertures. The aperture-lens forming electrode plate and the aperture lens plate may be excited to generate electric fields above and below the aperture lens plate. The electric field above the aperture lens plate may be different from the electric field below the aperture lens plate so that a lens field is formed in each aperture of the aperture lens plate, and the aperture lens array may thus be formed. One aperture lens of the aperture lens array may focus one primary beamlet.

In some embodiments, the beam-limit aperture array may comprise beam-limit apertures. It is appreciated that any number of apertures may be used, as appropriate. The beam-limit aperture array may be configured to limit diameters of individual primary beamlets 211, 212, and 213. Although FIG. 2 shows three primary beamlets 211, 212, and 213 as an example, however, it is appreciated that source conversion unit 220 may be configured to form any number of primary beamlets.

In some embodiments, an imaging lens may comprise a collective imaging lens configured to focus primary beamlets 211, 212, and 213 on an intermediate image plane. The imaging lens may have a principal plane orthogonal to primary optical axis 204. The imaging lens may be positioned below beam-limit aperture array and may be configured to focus primary beamlets 211, 212, and 213 such that the beamlets form a plurality of images of crossover 203 on the intermediate image plane.

Primary projection system 230 may be configured to project the images (virtual or real) onto sample 208 and form plural probe spots thereon. Primary projection optical system 230 may comprise an objective lens 231, a deflection scanning unit 232, and a beam separator 233. Beam separator 233 and deflection scanning unit 232 may be positioned inside primary projection optical system 230. Objective lens 231 may be configured to focus beamlets 211, 212, and 213 onto sample 208 for inspection and can form three probe spots 211S, 212S, and 213S, respectively, on surface of sample 208. In some embodiments, beamlets 211, 212, and 213 may land normally or substantially normally on sample 208. In some embodiments, focusing by the objective lens may include reducing the aberrations of the probe spots 211S, 212S, and 213S.

In response to incidence of primary beamlets 211, 212, and 213 on probe spots 211S, 212S, and 213S on sample 208, secondary electrons may emerge from sample 208 and generate three secondary electron beams 261, 262, and 263. Each of secondary electron beams 261, 262, and 263 typically comprise secondary electrons (having electron energy ≤50 eV) and backscattered electrons (having electron energy between 50 eV and the landing energy of primary beamlets 211, 212, and 213).

Electron beam tool 40 may comprise beam separator 233. Beam separator 233 may be of Wien filter type comprising an electrostatic deflector generating an electrostatic dipole field E1 and a magnetic dipole field B1 (both of which are not shown in FIG. 2). If they are applied, the force exerted by electrostatic dipole field E1 on an electron of beamlets 211, 212, and 213 is equal in magnitude and opposite in direction to the force exerted on the electron by magnetic dipole field B1. Beamlets 211, 212, and 213 can therefore pass straight through beam separator 233 with zero deflection angles.

Deflection scanning unit 232 may be configured to deflect beamlets 211, 212, and 213 to scan probe spots 211S, 212S, and 213S over three small scanned areas in a section of the surface of sample 208. Beam separator 233 may direct secondary electron beams 261, 262, and 263 towards secondary projection system imaging 250. Secondary projection imaging system 250 can focus secondary electron beams 261, 262, and 263 onto detection elements 241, 242, and 243 of electron detection device 240. Detection elements 241, 242, and 243 may be configured to detect corresponding secondary electron beams 261, 262, and 263 and generate corresponding signals used to construct images of the corresponding scanned areas of sample 208.

In FIG. 2, three secondary electron beams 261, 262, and 263 respectively generated by three probe spots 211S, 212S, and 213S, travel upward towards electron source 201 along primary optical axis 204, pass through objective lens 231 and deflection scanning unit 232 in succession. The three secondary electron beams 261, 262, and 263 are diverted by beam separator 233 (such as a Wien Filter) to enter secondary projection imaging system 250 along secondary optical axis 251 thereof. Secondary projection imaging system 250 may focus the three secondary electron beams 261, 262, and 263 onto electron detection device 240 which comprises three detection elements 241, 242, and 243. Therefore, electron detection device 240 can simultaneously generate the images of the three scanned regions scanned by the three probe spots 211S, 212S, and 213S, respectively. In some embodiments, electron detection device 240 and secondary projection imaging system 250 form one detection unit (not shown). In some embodiments, the electron optics elements on the paths of secondary electron beams such as, but not limited to, objective lens 231, deflection scanning unit 232, beam separator 233, secondary projection imaging system 250 and electron detection device 240, may form one detection system.

In some embodiments, secondary projection imaging system 250 will be shown and described together with the entire detection system, as illustrated in FIG. 2. With reference to FIG. 2, only three secondary electron beams 261, 262, and 263, with respect to three probe spots 211S, 212S, and 213S are shown, although there may be any number of secondary electron beams. Although not illustrated, secondary projection imaging system 250 may include components such as a zoom lens, a projection lens, a secondary beam-limit aperture array, and anti-scanning deflection unit, among other things, all aligned with secondary optical axis 251. Detection elements 241, 242, and 243 of electron detection device 240 may be placed along a plane normal to secondary optical axis 251. In some embodiments, the position and orientation of electron detection device 240 may be adjustable. Zoom lens, projection lens, and objective lens 231 may together project a surface of sample 208 onto a focus plane of the secondary electron beams, i.e. focus the secondary electron beams 261, 262, and 263 to form secondary-electron spots on detection elements 241, 242, and 243, respectively, when deflection scanning unit 232 is off.

As is commonly known in the art, the emission of secondary electrons obeys Lambert's law and has a large energy spread. While the energy of a secondary electron may be up to 50 eV, most have an energy of approximately 5 eV, depending on the sample material, among other things. The landing energy of the primary electron beamlets, such as the energy of beamlet 211 as it lands on sample 208, may be in the range of 0.1 keV to 5 keV. The landing energy may be adjusted by varying either or both of the potential of primary electron source 201 or the potential of sample 208, among other things. The excitation of objective lens 231 may be adjusted to provide the corresponding focusing power for the three beamlets. Further, for reduced aberrations, objective lens 231 may be a magnetic or an electromagnetic compound lens configured to rotate the beamlets and affect the landing energy. Because the size, the position, or the magnification of the secondary electron spots formed by the secondary electron beams 261,262, and 263 on detection elements 241, 242, and 243 may vary, the secondary electron spots may partially enter a detection element adjacent to the corresponding detection element. The secondary electrons detected by the adjacent detection elements may generate image overlaps, for example, causing deterioration of image resolution and reduction in collection efficiency. The image signal from one detection element may include information from more than one scanned region of sample 208, resulting in loss of resolution due to crosstalk.

In some embodiments, controller 50 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 50 may be configured to perform image processing steps with the multiple images of the same location of sample 208.

In some embodiments, controller 50 may include measurement circuitries (e.g., analog-to-digital converters) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 50 may control a motorized stage (not shown) to move sample 208 during inspection. In some embodiments, controller 50 may enable the motorized stage to move sample 208 in a direction continuously at a constant speed. In other embodiments, controller 50 may enable the motorized stage to change the speed of the movement of sample 208 over time depending on the steps of scanning process. In some embodiments, controller 50 may adjust a configuration of primary projection optical system 230 or secondary projection imaging system 250 based on images of secondary electron beams 261, 262, and 263.

In some embodiments, electron beam tool 40 may comprise a beamlet control unit 225 configured to receive primary beamlets 211, 212, and 213 from source conversion unit 220 and direct them towards sample 208. Beamlet control unit 225 may include a transfer lens configured to direct primary beamlets 211, 212, and 213 from the image plane to the objective lens such that primary beamlets 211, 212, and 213 normally or substantially normally land on surface of sample 208, or form the plurality of probe spots 221, 222, and 223 with small aberrations. Transfer lens may be a stationary or a movable lens. In a movable lens, the focusing power of the lens may be changed by adjusting the electrical excitation of the lens.

In some embodiments, beamlet control unit 225 may comprise a beamlet tilting deflector configured to may be configured to tilt primary beamlets 211, 212, and 213 to obliquely land on the surface of sample 208 with same or substantially same landing angles (Θ) with respect to the surface normal of sample 208. Tilting the beamlets may include shifting a crossover of primary beamlets 211, 212, and 213 slightly off primary optical axis 204. This may be useful in inspecting samples or regions of sample that include three-dimensional features or structures such as side walls of a well, or a trench, or a mesa structure.

In some embodiments, beamlet control unit 225 may comprise a beamlet adjustment unit configured to compensate for aberrations such as astigmatism and field curvature aberrations caused due to one or all of the lenses mentioned above. Beamlet adjustment unit may comprise an astigmatism compensator array, a field curvature compensator array, and a deflector array. The field curvature compensator array may comprise a plurality of micro-lenses to compensate field curvature aberrations of the primary beamlets 211, 212, and 213, and the astigmatism compensator array may comprise a plurality of micro-stigmators to compensate astigmatism aberrations of the primary beamlets 211, 212, and 213.

In some embodiments, the deflectors of the deflector array may be configured to deflect beamlets 211, 212, and 213 by varying angles towards primary optical axis 204. In some embodiments, deflectors farther away from primary optical axis 204 may be configured to deflect beamlets to a greater extent. Furthermore, deflector array may comprise multiple layers (not illustrated), and deflectors may be provided in separate layers. Deflectors may be configured to be individually controlled independent from one another. In some embodiments, a deflector may be controlled to adjust a pitch of probe spots (e.g., 221, 222, and 223) formed on a surface of sample 208. As referred to herein, pitch of the probe spots may be defined as the distance between two immediately adjacent probe spots on the surface of sample 208. In some embodiments, the deflectors may be placed on the intermediate image plane.

In some embodiments, controller 50 may be configured to control source conversion unit 220, beamlet control unit 225, and primary projection optical system 230, as illustrated in FIG. 2. Although not illustrated, controller 50 may be configured to control one or more components of electron beam tool 40 including, but not limited to, electron source 201 and components of source conversion unit 220, primary projection optical system 230, electron detection device 240, and secondary projection imaging system 250. Although FIG. 2 shows that electron beam tool 40 uses three primary electron beamlets 211, 212, and 213, it is appreciated that electron beam tool 40 may use two or more primary electron beamlets. The present disclosure does not limit the number of primary electron beamlets used in apparatus 40.

Backscattered electrons and secondary electrons can be emitted from the part of sample 208 upon receiving primary electron beamlets 211, 212, and 213, for example. Beam separator 233 can direct the secondary or backscattered electron beam(s), to a sensor surface of electron detection device 240. The detected electron beams can form corresponding beam spots on the sensor surface of electron detection device 240. Electron detection device 240 can generate signals (e.g., voltages, currents) that represent the intensities of the received beams, and provide the signals to a processing system, such as controller 50. The intensity of secondary or backscattered electron beams, and the resultant beam spots, can vary according to the external or internal structure of sample 208. Moreover, as discussed above, primary electron beamlets 211, 212, and 213 can be deflected onto different locations of the top surface of sample 208 to generate secondary or scattered electron beams (and the resultant beam spots) of different intensities. Therefore, by mapping the intensities of the beam spots with the locations of sample 208, the processing system can reconstruct an image that reflects the internal or external structures of wafer sample 208.

Figure 3A:
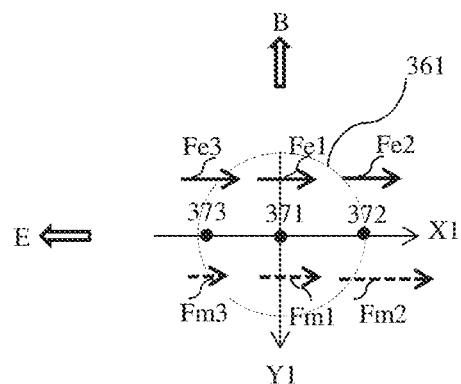
FIGS. 3A and 3B are schematic diagrams illustrating exemplary forces experienced and their influence on the path of the secondary electron beams in a multi-beam apparatus, consistent with embodiments of the present disclosure.
Figure 3B:
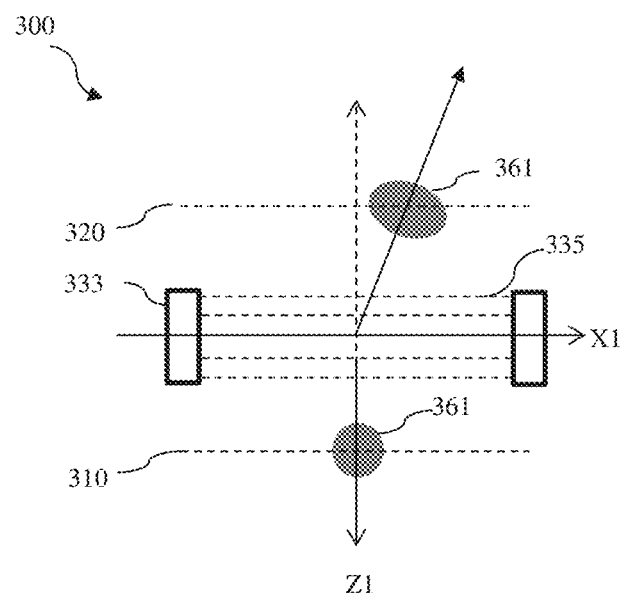

Reference is now made to FIGS. 3A and 3B, which are schematic diagrams of exemplary forces experienced by the secondary electrons and the influence of such forces on the path of the secondary electron beams in a multi-beam apparatus, consistent with embodiments of the present disclosure. FIG. 3A shows secondary electrons 371, 372, and 373 of an exemplary secondary electron beam 361 passing through a Wien filter (e.g., beam separator 233 of FIG. 2). It is appreciated that although a secondary electron beam comprises a beam of electrons, only three discrete secondary electrons 371, 372, and 373 are shown for illustrative purposes. Secondary electrons 371, 372, and 373 may be visualized as traveling along the Z1-axis (not shown), extending in-and-out of the plane of the paper. The electric field along X1-axis, and the magnetic field along Y1-axis, are represented as E and B, respectively.

In the Wien Filter, electrical potential reduces along the direction of electric field E. As a result, energy of off-axis secondary electron 372 of secondary electron beam 361 is higher than on-axis secondary electron 371, and energy of on-axis secondary electron 371 is higher than off-axis secondary electron 373, if secondary electrons 371, 372 and 373 have same energies before entering the Wien Filter. Hence, magnetic force Fm2 exerted on secondary electron 372 is stronger than magnetic force Fm1 exerted on electron 371, and magnetic force Fm1 is stronger than magnetic force Fm3 exerted on electron 373. The difference in magnetic forces (Fm3<Fm1<Fm2) experienced by secondary electrons (e.g., secondary electrons 371, 372, and 373), while passing through the Wien filter, may deflect secondary electrons by dissimilar deflection angles. The difference in deflection angles of electrons of a secondary electron beam may cause beam astigmatism, among other things.

Reference is now made to FIG. 3B, which shows an exemplary configuration 300 comprising a secondary electron beam 361 passing through a beam separator 333 disposed along X1-axis. It is appreciated that secondary electron beam 361 and beam separator 333 may be similar or substantially similar to secondary electron beam 261 and beam separator 233, respectively, of FIG. 2.

In some embodiments, secondary electron beam 361 may have a substantially circular cross-section before entering beam separator 333. FIG. 3B shows a projection of a substantially circular cross-section of secondary electron beam 361 on a plane 310. In some embodiments, plane 310 may be located along Z1-axis, between objective lens 231 and beam separator 333. The projection of secondary electron beam 361 on plane 310 may be substantially circular in cross-section before interaction with an electromagnetic field 335 in beam separator 333. Upon interaction with electromagnetic field 335 of beam separator 333, secondary electron beam 361 may be deflected and the cross-section of secondary electron beam 361 on plane 320 may be modified to a non-circular profile as a result of beam astigmatism.

Figure 3C:
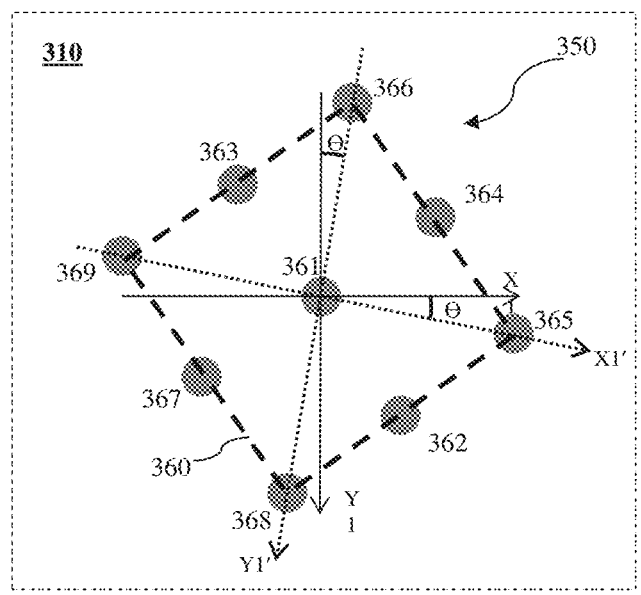
FIGS. 3C and 3D are schematic diagrams illustrating exemplary projections of the secondary electron beams before entering and after exiting the beam deflector, respectively, of the multi-beam apparatus, consistent with embodiments of the present disclosure.
Figure 3D:
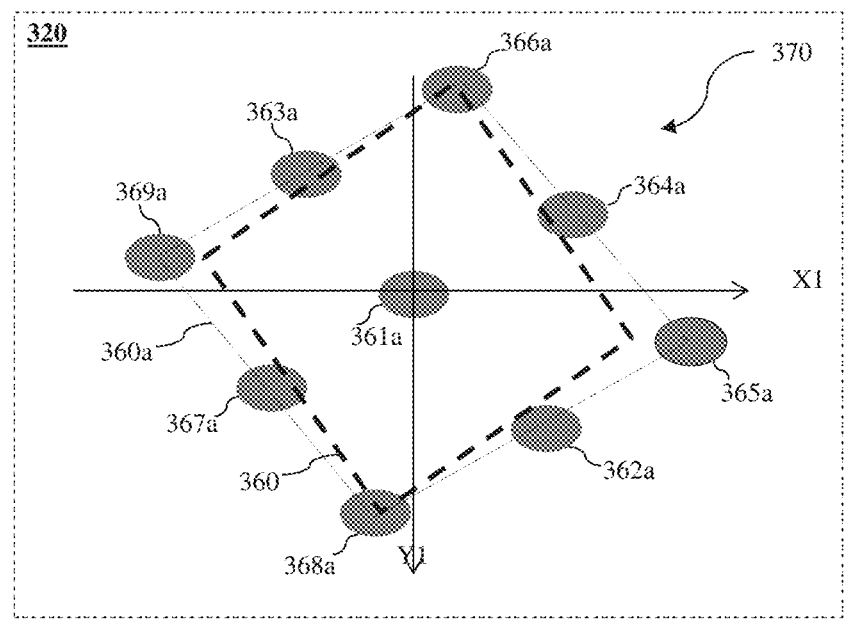

Reference is now made to FIGS. 3C and 3D, which illustrate schematic diagrams of arrays of secondary electron beams on planes 310 and 320, respectively. As shown in FIG. 3C, array 350 may comprise a 3×3 rectangular array of secondary electron beams originating from a sample (e.g., sample 208 of FIG. 2) and directed towards beam separator 333. For example, array 350 represents a square array comprising nine secondary electron beams 361, 362, 363, 364, 365, 366, 367, 368, and 369. In some embodiments, the square array may comprise fewer electron beams, such as in a 2×2 array, or more secondary electron beams such as in a 5×5 array, as appropriate. In some embodiments, the array may comprise a rectangular, a circular, a spiral, an elliptical array, a symmetric array, or an asymmetric array of secondary electron beams directed towards beam separator 333.

FIG. 3C illustrates an exemplary array 350 of secondary electron beams 361-369 and their projections on plane 310 before passing through the electric field E (along X1-axis direction) and the magnetic field B (along Y1-axis direction) of beam separator 333 (e.g., beam separator in FIG. 3A). Plane 310 may be a plane substantially parallel to the plane comprising X1- and Y1-axes, and substantially perpendicular to Z1-axis (not shown). The Z1-axis may be visualized as extending in-and-out of the paper.

In some embodiments, array 350 may comprise a square array of projections of secondary electron beams 361-369. As shown in FIG. 3C, an outline 360 of the square array of secondary electron beams 361-369, each having a circular cross-section is represented by the dashed lines. In some embodiments, array 350 may be oriented at an angle Θ with reference to X1- and Y1-axes such that it is aligned along X1'- and Y1'-axes. The orientation of array 350 with reference to X1- and Y1-axes may change with the landing energy of the corresponding primary electron beams (e.g., primary beamlets 211, 212, and 213 of FIG. 2) if the objective lens comprises a magnetic lens, among other things. As used herein, landing energy of the electron beams may be defined as the energy of the electrons of the primary electron beams as they impact the sample. The landing energy of the primary electron beams is equal to the potential difference between the electron emission source and the stage/sample, and therefore may be adjusted by changing either or both of these two potentials.

As shown in FIG. 3C, different secondary electron beams may traverse beam separator 333 at different transverse locations along the direction (X1-axis) of electric field E thereof. Consequently, a beam with a larger X1 coordinate may have a higher energy than a beam with a small X1 coordinate, and therefore may experience a stronger magnetic force. For secondary electron beams 361-369, the difference in magnetic force may cause difference in deflection angles and may result in beam array deformation as shown in FIG. 3D.

FIG. 3D illustrates an exemplary array 370 of exiting secondary electron beams 361a-369a and their projections on plane 320. Exiting secondary electron beams 361a-369a respectively correspond to secondary electron beams 361-369 after passing through beam separator 333. Because beam separator 333 generates beam astigmatism, as discussed above, exiting secondary electron beams 361a-369a may have a non-circular cross-section, different from circular cross-sections of incident secondary electron beams 361-369. For example, the cross-section of exiting secondary electron beams 361a-369a may comprise an oval, an elliptical, or a non-circular shape. In some embodiments, exiting secondary electron beams 361a-369a may be deflected towards secondary projection imaging system 250 along secondary optical axis 251.

In some embodiments, because beam separator 333 generates beam array deformation, as explained above, the beam array of exiting secondary electron beams 361a-369a may change into a diamond shape from the square shape of the beam array of incident secondary electron beams 361-369, as shown in FIG. 3D. Outline 360a of deformed array 370 of exiting secondary electron beams 361a-369a having a diamond shape is represented by the dash-dot lines. For comparison, FIG. 3D includes outline 360 of array 350 representing incident secondary electron beams 361-369.

In a multi-beam inspection apparatus, such as a multi-beam SEM, using a Wien filter (e.g., beam separator 333 of FIG. 3B) to separate primary electron beams (e.g., primary beamlets 211, 212, and 213 of FIG. 2) from secondary electron beams (e.g., 261, 262, and 263 of FIG. 2) may cause astigmatism aberration, and beam array deformation, among other things. The imaging resolution in a multi-beam SEM may depend on, among other things, crosstalk of secondary electron beams detected by an electron detection device (e.g., electron detection device 240 of FIG. 2) such as a secondary electron detector. The crosstalk may depend on the focus of the secondary electron beams incident on the electron detection device. If each secondary electron beam is focused such that it may be detected by the corresponding detection element of the electron detection device, the crosstalk will be zero. Beam astigmatism of beam separator may be one of several factors impacting the focus of a secondary electron beam, which may cause beam profile distortion, among other things. A defocused electron beam may have a large incidence spot on a secondary electron detector. Beam array deformation of beam separator may be one of several factors impacting beam array shape of secondary electron beams, which may cause beam pitch distortion on the electron detection device, among other things. A deformed beam array may not match detection element array of the electron detection device. In conventional multi-beam SEMs, the defocused secondary electron beam or a secondary beam in a deformed beam array may be incident upon multiple detection elements of the electron detection device. In other words, each of the multiple detection elements may receive secondary electrons from a corresponding secondary electron beam and other adjacent beams. Consequently, the imaging signal of one detection element may comprise a main component originating from the corresponding secondary electron beam and a crosstalk component originating from adjacent electron beams. The crosstalk component, among other things, may deteriorate the fidelity of the imaging signal. Therefore, it is desirable to minimize crosstalk between multiple detection elements to enhance image resolution and enhance detection efficiency or collection efficiency of electron detection devices to enhance the imaging throughput.

Some of the several ways to mitigate the occurrence and impact of crosstalk, among other things, may include using an aperture mechanism in secondary projection imaging system 250 to block off peripheral secondary electrons, or reducing the size of the corresponding detection elements of electron detection device. However, reducing the number of secondary electrons incident on the electron detector by blocking the peripheral electrons or by reducing the size of the corresponding detection elements may negatively impact the collection and the detection efficiency, thereby reducing the inspection throughput, among other things.

Figure 3E:
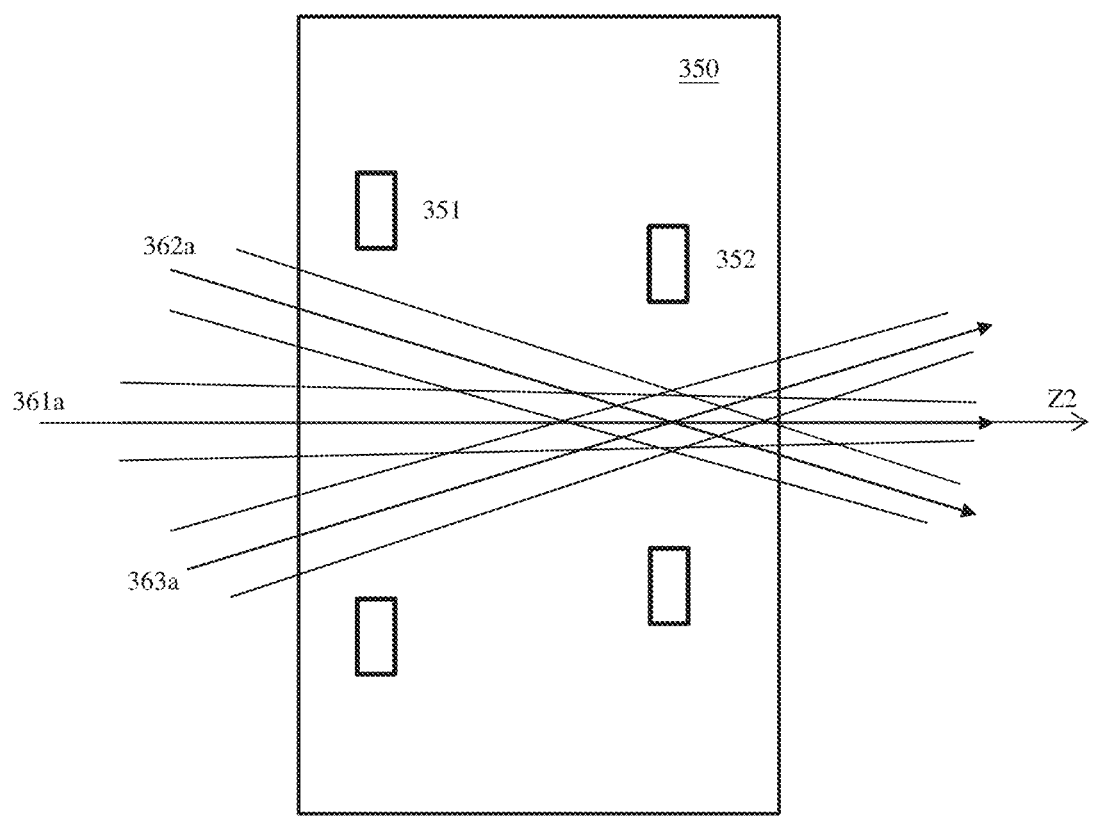
FIG. 3E is a schematic diagram illustrating an exemplary secondary projection imaging system comprising stigmators in a multi-beam apparatus, consistent with embodiments of the present disclosure.

In conventional SEM systems, a secondary projection imaging system in a multi-beam apparatus may include one or more stigmators to compensate the beam astigmatism aberration and the beam array deformation so as to minimize the crosstalk. FIG. 3E illustrates a schematic diagram of a secondary projection imaging system 350 in a multi-beam apparatus (e.g., apparatus 40 of FIG. 2). Secondary projection imaging system 350 may comprise stigmators 351 and 352 configured to compensate the beam array deformation and astigmatism aberration of individual exiting secondary electron beams 361a, 362a, and 363a passing through secondary projection imaging system 350. In some embodiments, stigmator 352 may be placed at or close to the crossover of exiting secondary electron beams 361a, 362a, and 363a and configured to compensate the beam astigmatism aberration. Stigmator 351 may be placed away from the crossover and may be configured to compensate the beam array shape deformation.

In addition, though stigmators 351 and 352 may be configured to minimize the crosstalk by compensating the astigmatism aberration and beam array deformation, using multiple stigmators may increase the structural and operational complexity of secondary projection imaging system 350, thereby negatively impacting the inspection throughput, among other things. Although only three exiting secondary electron beams are illustrated in the cross-sectional view in FIG. 3E, it is appreciated that there may be any number of exiting secondary electron beams, as needed.

In multi-beam inspection systems, astigmatism aberration or beam array deformation of secondary electron beams may cause crosstalk, and therefore, negatively impact inspection throughput and resolution, among other things. Astigmatism aberration or beam array deformation may be caused by several factors including, but are not limited to, using a Wien filter as beam separator (e.g., beam separator 333 of FIG. 3B), as discussed in FIGS. 3A-3E, using a beam deflector (e.g., deflection scanning unit 232 of FIG. 2), or using a secondary projection imaging system (e.g., secondary projection imaging system 250 of FIG. 2).

Figure 4A:
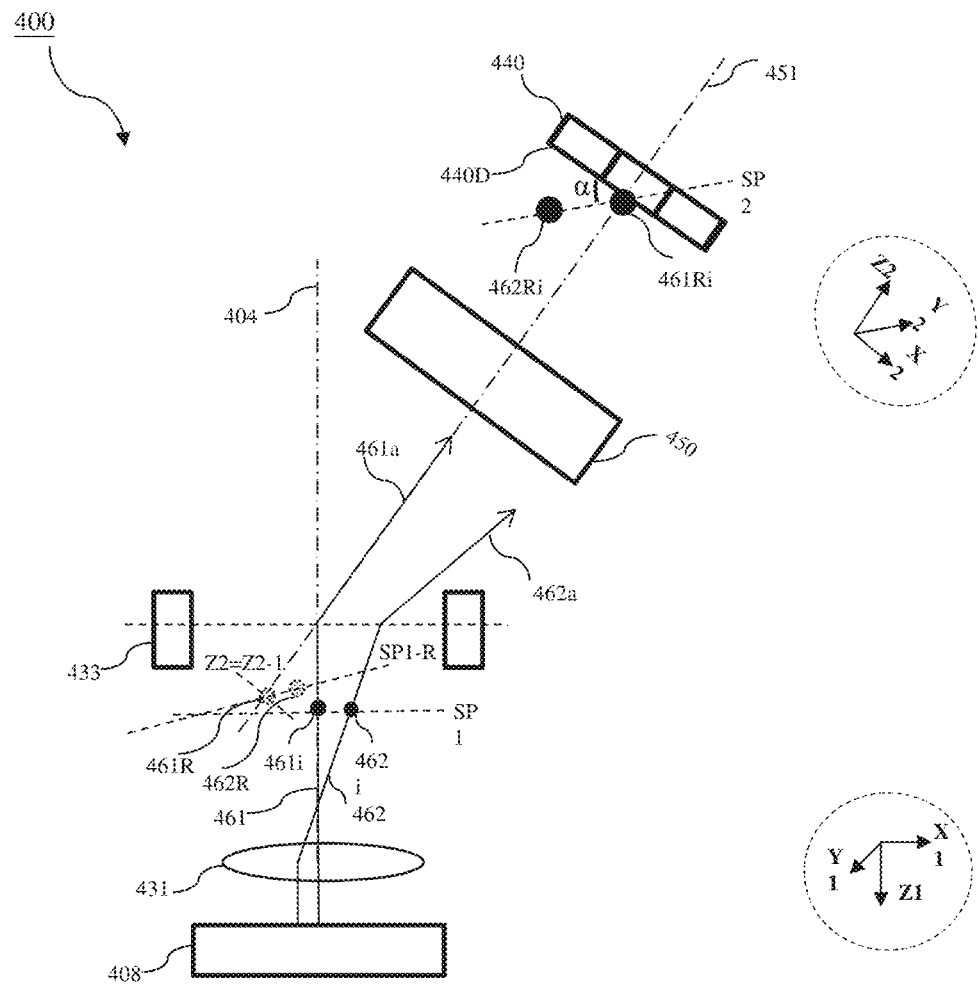
FIG. 4A is a schematic diagram illustrating an exemplary configuration of an electron optics system and the path of secondary electron beams in a multi-beam apparatus, consistent with embodiments of the present disclosure.

Reference is now made to FIG. 4A, which illustrates a schematic diagram of a multi-beam inspection apparatus 400 that can be a part of the exemplary charged particle beam inspection system 100 of FIG. 1, consistent with embodiments of the present disclosure. Multi-beam inspection apparatus 400 (also referred to herein as apparatus 400) may comprise a primary projection optical system (analogous to primary projection optical system 230 of FIG. 2) including objective lens 431 and beam separator 433. Apparatus 400 may further comprise a secondary projection imaging system 450 (analogous to secondary projection imaging system 250 of FIG. 2) and an electron detection device 440, among other relevant components. It may be appreciated that other commonly known components of apparatus 40 may be added/omitted as appropriate.

Objective lens 431 may be substantially similar to and may perform substantially similar functions as objective lens 231 of FIG. 2 including, but is not limited to, focusing primary electron beams or beamlets onto sample 408 for inspection and forming corresponding probe spots. Beam separator 433 may be substantially similar to and may perform substantially similar functions as beam separator 233 of FIG. 2 including, but is not limited to, directing secondary electron beams 461, 462 towards secondary projection system imaging 450. Although, FIG. 4A illustrates only two secondary electron beams 461 and 462, it is appreciated that the number of secondary electron beams generated from sample 408 and directed towards secondary projection system imaging 450 may be more or fewer, as appropriate. Objective lens 431 and beam separator 433 may be aligned with a primary optical axis 404 of apparatus 400, and secondary projection imaging system 450 and electron detection device 440 may be aligned with a secondary optical axis 451 of apparatus 400. Secondary optical axis 451 may form a non-zero angle with primary optical axis 404. In some embodiments, the angle between primary optical axis 404 and secondary optical axis 451 may be determined based on the desired deflection of secondary electron beams 461 and 462 by beam separator 433, among other things.

Upon interaction of the primary electron beams or beamlets with sample 408, secondary electrons or backscattered electrons may be generated from sample 408. The generated secondary electrons and backscattered electrons may travel in the opposite direction of primary electron beams along primary optical path 404. Apparatus 400 may be operated in a secondary electron inspection mode or a backscattered electron inspection mode, or both. In a secondary electron inspection mode, electron detection device 440 may be configured to detect secondary electron beams 461 and 462. Objective lens 431 may be configured to focus secondary electron beams 461 and 462 generated from corresponding probe spots on sample 408 onto plane SP1 and therefore form intermediate images 461i and 462i of the probe spots thereon. Hence, plane SP1 is an intermediate image plane of the probe spots. In some embodiments, intermediate image plane SP1 may be formed between beam separator 433 and objective lens 431, and may be substantially perpendicular to primary optical axis 404. Intermediate image plane SP1 may be the focus plane of secondary electron beams 461 and 462 before entering the electrical field region or magnetic field region of beam separator 433.

Beam separator 433 may be configured to deflect secondary electron beams 461 and 462 towards secondary projection imaging system 450. In FIG. 4A, after exiting beam separator 433, secondary electron beams 461 and 462 become exiting secondary electron beams 461a and 462a (analogous to 361a and 362a of FIG. 3D), and intermediate images 461i and 462i become virtual intermediate images 461R and 462R on a virtual intermediate image plane SP1-R. Virtual intermediate images 461R and 462R may be objects for secondary projection imaging system 450, and virtual intermediate image plane SP1-R may be object plane for secondary projection imaging system 450. In some embodiments, virtual intermediate image plane SP1-R may be rotated by an angle with reference to intermediate image plane SP1 such that it is not perpendicular to primary optical axis 404. In some embodiments, virtual intermediate image plane SP1-R may be rotated by an angle based on the deflection angle of secondary electron beams. As shown in FIG. 4A, on-axis secondary electron beam 461 may be deflected substantially parallel to and along secondary optical axis 451, and virtual intermediate image plane SP1-R may be not substantially perpendicular to secondary optical axis 451.

In conventional multi-beam inspection systems, electron detection device 440 and secondary projection imaging system 450 may be placed substantially perpendicular to secondary optical axis 451. Secondary projection imaging system 450 may be configured to focus exiting secondary electron beams 461a and 462a onto plane SP2 and therefore, image virtual intermediate images 461R and 462R thereon, i.e. forming images 461Ri and 462Ri of the probe spots on plane SP2. Hence, plane SP2 is a final image plane of the probe spots or a final focus plane of secondary electron beams 461 and 462. In some embodiments, virtual intermediate image plane SP1-R may not be substantially perpendicular to secondary optical axis 451, and accordingly, final image plane SP2 may not be perpendicular to secondary optical axis 451. As a result, final image plane SP2 may not overlap with a detection surface 440D of electron detection device 440. Detection surface 440D may be substantially perpendicular to secondary optical axis 451. Detection surface 440D may comprise an electron-collecting or an electron-receiving surface of a detection element of electron detection device 440. In some embodiments, detection elements of electron detection device 440 may be arranged such that the detection surfaces of all detection elements form a single coplanar detection surface 440D.

In some embodiments, final image plane SP2 may form an angle α with reference to detection surface 440D. The mismatch of final image plane SP2 and detection surface 440D of electron detection device 440 may result in exiting secondary electron beams to be defocused on detection surface 440D of electron detection device 440 and the exiting secondary beam array to be deformed on detection surface 440D of electron detection device 440. The defocused secondary electron beams and deformed secondary beam array may cause crosstalk and reduce collection or detection efficiency and resultantly may negatively impact the inspection resolution and inspection throughput, among other things.

Figure 4B:
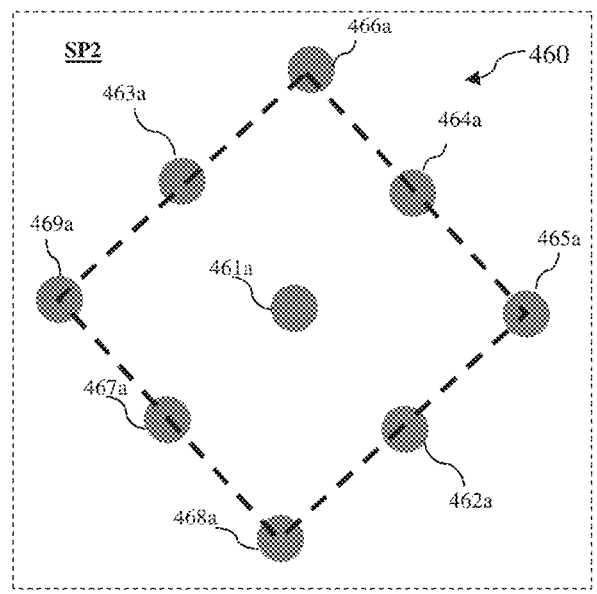
FIGS. 4B and 4C are schematic diagrams illustrating exemplary projections of the secondary electron beams on a final image plane and an electron detector, respectively, of the multi-beam apparatus, consistent with embodiments of the present disclosure.
Figure 4C:
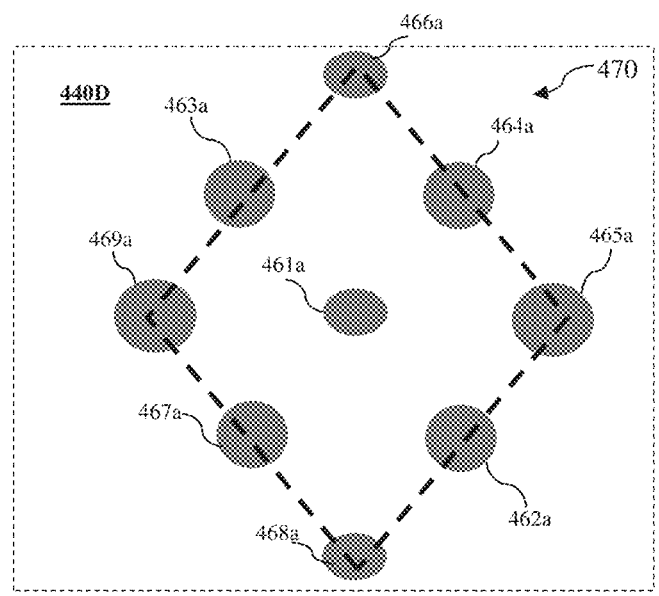

Reference is now made to FIGS. 4B and 4C, which illustrate schematic diagrams of exemplary projections of exiting secondary electron beams 461a-469a on final image plane SP2 and on detection surface 440D of electron detection device 440, respectively, consistent with embodiments of the present disclosure. exiting secondary electron beams 461a-469a may form an array 460 on final image plane SP2, as shown in FIG. 4B. In some embodiments, array 460 may comprise a diamond, a rectangular, or a square array. Projections of focused exiting secondary electron beams 461a-469a may be substantially circular in cross-section on final image plane SP2.

FIG. 4C illustrates a projection of exiting secondary electron beams 461a-469a on detection surface 440D of electron detection device 440. Projections of exiting secondary electron beams 461a-469a on detection surface 440D of electron detection device 440 may be represented by an array 470. In some embodiments, the tilt angle of final image plane SP2 with reference to detection surface 440D may cause projections of one or more exiting secondary electron beams 461a-469a on detection surface 440D non-circular. The tilt angle of final image plane SP2 with reference to detection surface 440D may cause the projection of exiting secondary electron beams 461a-469a to form a deformed array 470 on detection surface 440D. Deformed array 470 may comprise a tilted array of non-circular projections of exiting secondary electron beams 461a-469a. In the context of this disclosure, a deformed array (e.g., deformed array 470 of FIG. 4C) may comprise an array of projections of defocused secondary electron beams or an array having an outline of projections of out-of-focus secondary electron beams different compared to the outline of in-focus secondary electron beams.

As illustrated in FIG. 4C, the size of the projection of an exiting secondary electron beam on detection surface 440D of electron detection device 440 may be based on a distance between the focus position on the final image plane SP2 of secondary electron beams 461a-469a and detection surface 440D. For example, on-axis exiting secondary electron beam 461a may appear smaller than the off-axis exiting secondary electron beams 462a because on-axis exiting secondary electron beam 461a on final image plane SP2 is closer to detection surface 440D compared to off-axis exiting secondary electron beam 462a. The final image plane SP2 may be formed at an angle with respect to detection surface 440D such that exiting secondary electron beams may be in focus, for example, upstream of electron detection device 440, at or close to detection surface 440D of electron detection device 440, or downstream of electron detection device 440. In the context of this disclosure, "upstream" or "downstream" may refer to the location of a system element with reference to another element along the path of the secondary electron beam. For example, if element A is downstream of element B, it is appreciated that element A is located after element B along the secondary electron beam path. If element A is upstream of element B, it is appreciated that element A is located before element B along the secondary electron beam path. It is appreciated that array 460 may comprise beam astigmatism and beam array deformation due to beam separator 433, resulting in a non-circular projection of one or more exiting secondary electron beams. It is appreciated that array 470 comprises projection of modified secondary electron beams 461a-469a that are not corrected for astigmatism aberration, resulting in a non-circular projection of one or more modified secondary electron beams. It is to be also appreciated that while final image plane SP2 is shown tilted at an angle α with reference to Z2-axis, it may be tilted in any of X2-, Y2-, or Z2-axis, or a combination thereof.

The deformation of secondary electron beams array and defocused secondary electron beams incident on electron detection device 440 may cause a reduction in collection efficiency, or crosstalk, among other things. For example, if the pitches and sizes of electron detectors (e.g., detection elements 241, 242, and 243 of FIG. 2) cannot cover the deviation of position of exiting secondary electron beams 461a-469a in deformed array 470, the image signal from one electron detector may include information from more than one exiting secondary electron beams, thus crosstalk may occur. In some embodiments, only a portion of electrons of an exiting secondary electron beam may be collected by the corresponding electron detector, negatively impacting the inspection throughput and resolution.

In existing multi-beam inspection tools such as a multi-beam SEM, some of the challenges encountered include, among other things, limitations in collection efficiency of each secondary electron beam of secondary electron beam array and crosstalk among secondary electron beams of secondary electron beam array. One of several factors that may cause reduction in collection efficiency is a large spot size of the secondary electron beam incident on the detection surface of the electron detector. The size of the beam incident on the electron detector depends on, among other things, the location of the electron detector with reference to the final focus plane of the secondary electron beams. For example, the size of the secondary electron beam incident on the electron detector may increase as the distance between the position of the secondary electron beam on the final focus plane of the secondary electron beams and the electron detector increases. Therefore, it may be desirable to configure the electron detection device to make its detection surface overlap with the final image plane of the secondary electron beams as much as possible.

In some embodiments, the tilt angle of final image plane SP2 of the secondary electron beams with reference to the detection surface 440D may change with the rotation angle of virtual intermediate image plane SP1-R with reference to intermediate image plane SP1. The rotation angle may change with the position of intermediate image plane SP1 and excitations of beam separator 433. The position of intermediate image plane SP1 and excitations of beam separator 433 may change with landing energies or probe currents of primary electron beams on sample 408, among other things. Hence, the tilt angle of final image plane SP2 of the secondary electron beams with reference to detection surface 440D may vary based on the application conditions, among other things. Therefore, it may be desirable to minimize the tilt angle within the range of the application conditions by tilting the electron detection device by a fixed optimal angle or an adjustable angle with respect to secondary optical axis 451, as shown in FIG. 5, while maintaining the inspection throughput.

Figure 5:
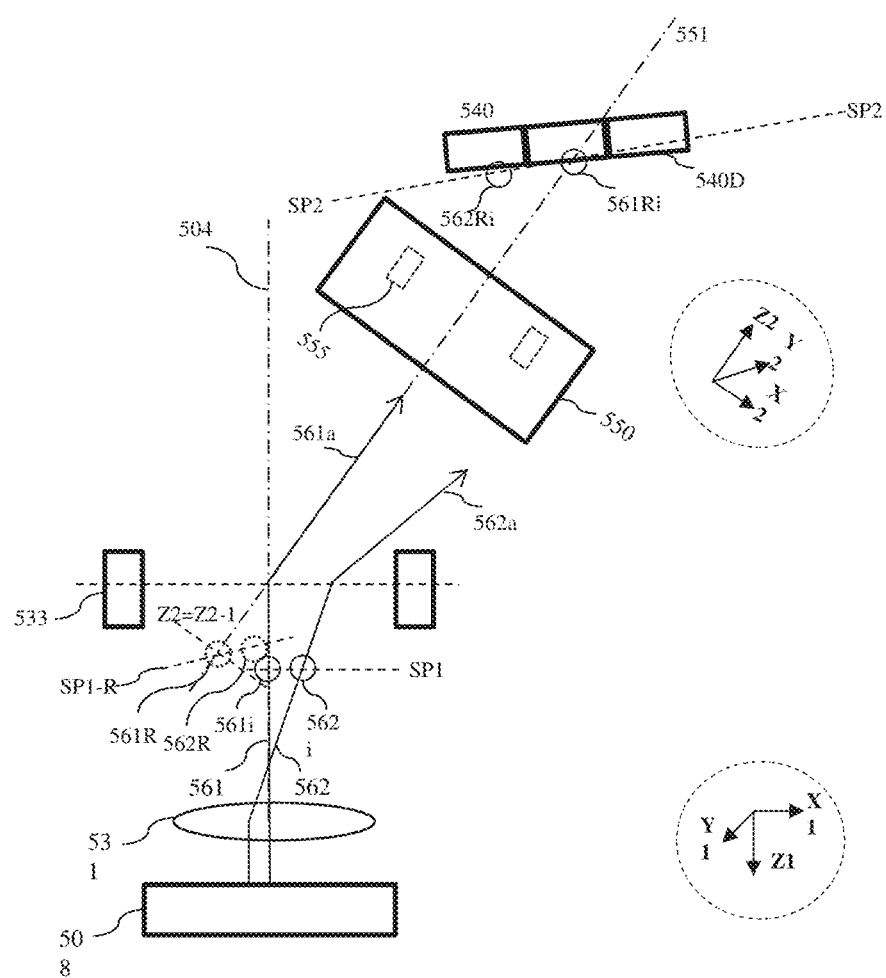
FIG. 5 is a schematic diagram illustrating an exemplary configuration of an electron optics system and the path of secondary electron beams in a multi-beam apparatus, consistent with embodiments of the present disclosure.

Reference is now made to FIG. 5, which illustrates a schematic diagram of a multi-beam inspection apparatus 500 that can be a part of the exemplary charged particle beam inspection system 100 of FIG. 1, consistent with embodiments of the present disclosure. Multi-beam inspection apparatus 500 (also referred to herein as apparatus 500) may comprise a primary projection optical system (analogous to primary projection optical system 230 of FIG. 2) including objective lens 531 and beam separator 533, among other things. Apparatus 500 may further comprise a secondary projection imaging system 550 (analogous to secondary projection imaging system 250 of FIG. 2) and an electron detection device 540 having a detection surface 540D configured to detect secondary electrons, among other components. It may be appreciated that other components of apparatus 40 may be added/omitted, as appropriate.

In some embodiments, in apparatus 500, primary electron beamlets (not shown, e.g., primary electron beamlets 211 and 212 of FIG. 2) traveling along primary optical axis 504 may land on a surface of sample 508. Upon interaction with sample 508, secondary electrons or backscattered electrons may be generated from sample 508. The generated secondary electrons and backscattered electrons may travel in the opposite direction of primary electron beams along primary optical axis 504. Apparatus 500 may be operated in a secondary electron inspection mode or a backscattered electron inspection mode, or both, based on the energy of the electrons generated from sample 508. In a secondary electron inspection mode, electron detection device 440 may be configured to detect secondary electron beams 461 and 462. In some embodiments, objective lens 531 may be substantially similar to and may perform substantially similar functions as objective lens 431 of FIG. 4A. Objective lens 531 may be configured to focus secondary electron beams 561 and 562 generated from corresponding probe spots on sample 508 and to form images of the probe spots on intermediate image plane SP1.

Secondary electron beams 561 and 562 are directed towards beam separator 533 (e.g., a Wien filter) configured to isolate primary electron beams and secondary electron beams, for example, based on the energy, or velocity, among other things. Beam separator 533 may be configured to deflect secondary electron beams 561 and 562 and form exiting secondary electron beams 561a and 562a, respectively. Exiting secondary electron beams 561a and 562a may be directed towards secondary projection imaging system 550 along Z2-axis, also referred to herein as secondary optical axis 551, as illustrated in FIG. 5. Exiting secondary electron beam 561a may comprise an on-axis exiting secondary electron beam and modified secondary electron beam 562a may comprise an off-axis exiting secondary electron beam. In the context of this disclosure, "on-axis" may refer to electron beams that are substantially parallel, aligned, or coincident with the reference axis, and "off-axis" may refer to electron beams that are non-parallel or not aligned with the reference axis. It is appreciated that in a multi-beam configuration, there may be more than one off-axis primary electron beams and corresponding exiting secondary electron beams.

In some embodiments, secondary projection imaging system 550 may comprise a stigmator 555 configured to compensate astigmatisms of secondary electron beams such as 561 and 562. One of the several factors that may cause astigmatism is the beam astigmatism generated by beam separator 533, as discussed in reference to FIGS. 3A-3E. The beam astigmatism may refer to deformation of the electron beam profile caused when the electrons in the beam pass through deflection fields of beam separator 533.

Stigmators such as stigmator 555 may be configured to apply a correcting quadrupole field to the secondary electron beams as the beams pass through. The quadrupole field experienced by the secondary electrons may be adjusted by adjusting the electrical excitation of stigmator 555. Adjusting the electrical excitation of stigmator 555 may include, but is not limited to, adjusting a voltage or a coil current applied to one or more poles of stigmator 555. In some embodiments, stigmator 555 may be placed on or close to a cross-over plane of secondary electron beams. In some embodiments, though not illustrated, secondary projection imaging system 550 may further include a zoom lens, a projection lens, anti-scanning deflection unit, and the like.

In some embodiments, adjusting the electrical excitation of stigmator 555 may comprise adjusting the profile of exiting secondary electron beams 561a and 562a from a non-circular cross-section to a substantially circular cross-section. In some embodiments, the electrical excitation of stigmator 555 may be adjusted to adjust the profile of one or more secondary electron beams, as desired. In some embodiments, the electrical excitation of stigmator 555 may be adjusted based on the application, the desired analysis, the sample, the desired throughput, among other things.

Secondary projection imaging system 550 may be configured to focus exiting secondary electron beams 561a and 562a on final image plane SP2, also referred to herein as final image plane. Final image plane SP2 may comprise a focus plane of exiting secondary electron beams 561a and 562a. The profile of focused exiting secondary electron beams 561a and 562a may be substantially circular, as shown in FIG. 5, after exiting stigmator 555 of secondary projection imaging system 550. In some embodiments, final image plane SP2 may comprise a flat focus plane such that the exiting secondary electron beams are focused on the same flat plane.

In practice, however, exiting secondary electron beams of a beam array may be focused on a curved focus plane comprising a plurality of flat focus planes. One of the several reasons for non-coplanar focus of exiting secondary electron beams may include, but is not limited to, field curvature aberration. In the context of this disclosure, field curvature aberration, also known as Petzval field curvature, may refer to as an imaging artifact or an aberration in which a flat object normal to the optical axis cannot be brought properly into focus on a flat image plane. When visible light is focused through a lens, the image plane produced by the lens is a curved Petzval surface. The image can be focused over a large number of focus planes to produce either a sharp focus on the edges or in the center of the image. When the specimen is viewed in a microscope, it either appears sharp and crisp in the center or on the edges of the view field, but not both. This artifact is commonly referred to as field curvature or curvature of field and the aberration caused thereby is known as field curvature aberration.

In some embodiments, final image plane SP2 may be non-perpendicular to secondary optical axis 551, in part because virtual intermediate image plane SP1-R formed by objective lens 531 and beam separator 533 is not perpendicular to secondary optical axis 551, among other things. In conventional multi-beam inspection systems, an electron detector may be placed perpendicular to a secondary optical axis, while the final image plane is non-perpendicular to secondary optical axis. Such a configuration may result in one or more exiting secondary electron beams to be defocused on detection surface of electron detection device, and deformation of exiting secondary electron beam array in the direction of the tilt of the final image plane. The beam defocus and beam array deformation may cause a reduction in collection efficiency, and a reduction in throughput, among other things.

In multi-beam inspection systems such as apparatus 500, occurrence of crosstalk and reduction in collection efficiency may be mitigated by tilting electron detection device 540 to make its detection surface overlap with the final image plane SP2. The tilting angle of electron detection device 540 may be fixed at a value optimized for all of application conditions or may be adjustable. In some embodiments, the position or orientation of electron detection device 540 may be adjustable along X2-, Y2-, or Z2-axes, or a combination thereof. Adjustable electron detection device 540 may be placed downstream of secondary projection imaging system 550.

In some embodiments, electron detection device 540 may be disposed along a detection plane (not shown). In some embodiments, the detection plane of electron detection device 540 may form an angle α with final image plane SP2, as illustrated in FIG. 4A. Adjusting the position of electron detection device 540 may comprise adjusting the angle α between the detection plane of electron detection device 540 and final image plane SP2. In some embodiments, adjusting the angle α may comprise tilting electron detection device 540 along one or more axes by a tilting angle to reduce the angle α between the detection plane of electron detection device 540 and final image plane SP2. In some embodiments, the angle α may be reduced such that the principal plane of electron detection device 540 may substantially coincide with final image plane SP2. In this context, "substantially coincident" planes may refer to overlapping or almost overlapping planes such that the angle between the planes is less than 5°. In a preferred embodiment, the angle between almost overlapping planes is between 0° to 1°.

In some embodiments, electron detection device 540 may comprise an array of detection elements (e.g., detection elements 241-243 of FIG. 2). Electron detection device 540 may comprise a rectangular array, a square array, a triangular array, a circular array, or an irregular array of detection elements. In some embodiments, detection elements of electron detection device 540 may comprise a scintillator, a solid-state detector, a scintillator-photomultiplier assembly, among other things. In some embodiments, detection surface 540D of detection elements of electron detection device 540 may represent the surface on which the secondary electron beam may be incident.

In some embodiments, controller 50 may be configured to communicate with and adjust the movement of electron detection device 540. Controller 50 may be configured to cause dynamic adjustment of the position and orientation of electron detection device 540 based on the determined collection efficiency of electron detection device 540. For example, if the collection efficiency increases by tilting electron detection device 540 along an axis, controller 50 may continue tilting electron detection device 540 along the axis.

In some embodiments, the position or orientation of electron detection device 540 may be adjusted by adjusting the tilting angle in one or more axes based on the application, the desired analysis, the sample, the desired throughput, among other things. In some embodiments, the tilting angle may be adjusted by a predetermined value based on the application, the desired analysis, the sample, the desired throughput, among other things. The predetermined value of tilting angle may be an optimal tilting angle based on a range of landing energies, probe currents, and on-sample electric field, among other things.

In some embodiments, electron detection device 540 may be aligned with secondary optical axis 551 such that the geometric center of detection surface 540D of electron detection device 540 intersects with secondary optical axis 551, as illustrated in FIG. 5. The spot size of a secondary electron beam incident on a detection element may depend on a scalar distance between its positions on final image plane SP2 and detection surface 540D. Electron detection device 540 may be placed to minimize the scalar distances of all the secondary electron beams.

Figure 6:
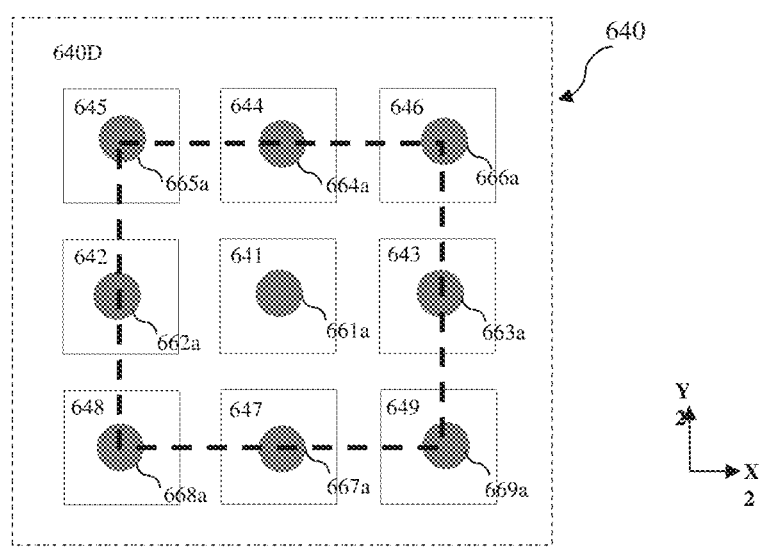
FIG. 6 is a schematic diagram illustrating an exemplary configuration of an electron detector in a multi-beam apparatus, consistent with embodiments of the present disclosure.

Reference is made to FIG. 6, which illustrates an exemplary configuration of an electron detection device 640 and projection of exiting secondary electron beams incident thereon, consistent with embodiments of the present disclosure. Electron detection device 640 may be substantially similar or perform substantially similar functions as electron detection device 540 of FIG. 5. In some embodiments, electron detection device 640 may include an array of detection elements 641-649 configured to detect secondary electrons of exiting secondary electron beams 661a-669a. In some embodiments, each exiting secondary electron beam may have a corresponding detection element, as shown in FIG. 6. Such a configuration may provide some advantages, including, but are not limited to, reduced crosstalk, increased throughput, or higher collection efficiency.

FIG. 6 illustrates projections of tilting secondary electron beams 661a-669a on a detection surface 640D of electron detection device 640. Detection surface 640D may be configured to receive or collect secondary electrons of exiting secondary electron beams 661a-669a exiting secondary projection imaging system (e.g., secondary projection imaging system 550 of FIG. 5), and containing information about probed regions of a sample (e.g., sample 508 of FIG. 5). It is appreciated that substantially circular cross-sections of projections of tilting secondary electron beams 661a-669a on detection surface 640D indicate that tilting secondary electron beams 661a-669a are substantially focused on detection surface 640D. One of the several methods to substantially focus exiting secondary electron beams 661a-669a and enhance collection efficiency, among other things, may include compensating the astigmatism aberration using a stigmator (e.g., stigmator 555 of FIG. 5) and adjusting the position or orientation of detection surface 640D of electron detection device 640 to reduce the angle α formed between final image plane SP2 and a detection surface (e.g., detection surface 540D of FIG. 5). In some embodiments, to maximize the collection efficiency, among other things, the angle α may be reduced such that detection surface 640D substantially coincides with final image plane SP2.

In some embodiments, the surface area of two or more detection elements 641-649 may be similar. The surface area or the electron collection area may be based on the size or cross-section of the incident exiting secondary electron beams 661a-669a. For example, the surface area of detection element 641 may be larger than the size of the incident exiting secondary electron beam 661a to collect and detect substantially all secondary electrons of exiting secondary electron beam 661a, thereby maximizing collection efficiency, and inspection throughput, among other things. In some embodiments, the position or orientation of electron detection device 640 may be adjusted such that substantially all secondary electrons of an exiting secondary electron beams 661a-669a may be collected by their corresponding detection elements 641-649, to maximize collection efficiency and inspection throughput, among other things.

In some embodiments, detection elements 641-649 may be arranged in an array, the array comprising a square array, a rectangular array, a circular array, a triangular array, an elliptical array, or the like. The detection elements arranged in an array may have a uniform or a non-uniform pitch along X2-axis or Y2-axis. It is appreciated that though FIG. 6 illustrates electron detection device 640 comprising nine detection elements 641-649 configured to collect secondary electrons of nine exiting secondary electron beams 661a-669a generated by a 3×3 array of primary electron beamlets incident on a surface of the sample (e.g., sample 508 of FIG. 5), more or fewer detection elements may be employed, based on a number of secondary electron beams generated, among other things.

In some embodiments, in addition to compensating the astigmatism aberration and tilting electron detector (e.g., electron detection device 540 of FIG. 5), orientation of primary electron beamlets (e.g., primary beamlets 211-213 of FIG. 2) with reference to X1- and Y1-axes may be adjusted such that the generated secondary electron beams 361-363 may be aligned in the deflection direction of beam separator 333. It is appreciated that although FIG. 2 illustrates only three electron beamlets, at least two or more electron beams may be used, as appropriate. For example, a 3×3 array of nine primary electron beams may be used to generate a 3×3 array of secondary electron beams (e.g., secondary electron beams 361-369 of FIG. 3C). It is to be appreciated that beam separators 233, 333, 433, and 533 may be substantially similar and may perform substantially similar functions.

Figure 7A:
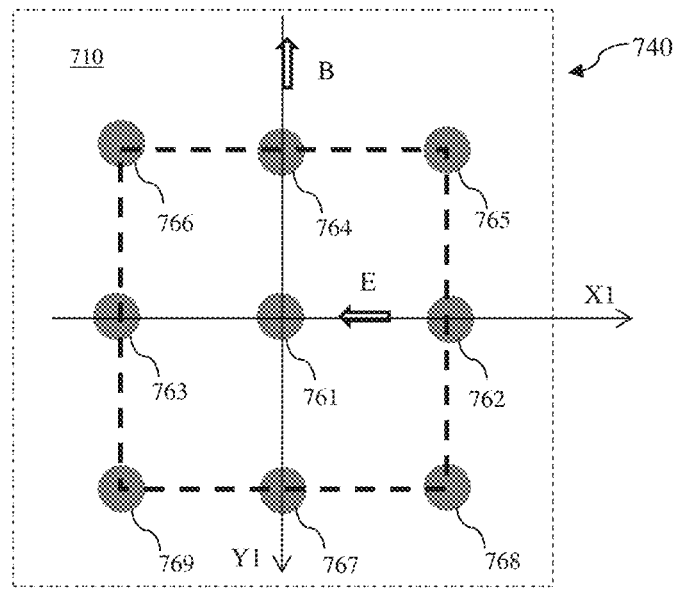
FIGS. 7A and 7B are schematic diagrams illustrating exemplary projections of the secondary electron beams before entering and after exiting the beam deflector, respectively, consistent with embodiments of the present disclosure.

In some embodiments, adjusting the orientation of primary electron beamlets may include rotating the primary electron beamlets around primary optical axis (e.g., primary optical axis 204 of FIG. 2) such that the resultant secondary electron beams may be rotated correspondingly to form a secondary electron beam array 740, as shown in FIG. 7A. Secondary electron beam array 740 may comprise a substantially square 3×3 array of secondary electron beams 761, 762, 763, 764, 765, 766, 767, 768, and 769, originating upon interaction of primary electron beamlets with a sample (e.g., sample 208 of FIG. 2), and directed towards beam separator (e.g., beam separator 533 of FIG. 5). Secondary electron beam array 740, as illustrated in FIG. 7A, may represent a projection of an array of secondary electron beams 761-769 on a plane 710 before entering beam separator 533. Plane 710 may be a plane substantially parallel to the plane comprising X1- and Y1-axes (e.g., X1- and Y1-axes shown in FIG. 4A), and substantially perpendicular to Z1-axis (e.g., Z1-axis shown in FIG. 4A). As a visual aid, Z1-axis may be visualized as extending in-and-out of the paper.

In some embodiments, the angle of rotation of primary electron beamlets to cause formation of secondary electron beam array 740 of secondary electron beams 761-769 may be determined based on, but is not limited to, the orientation of source conversion unit 220, among other things. The orientation of source conversion unit 220 to adjust the rotation of primary electron beamlets may be adjusted such that secondary electron beam array 740 is aligned in the direction of deflection of secondary electron beams 761-769 by beam separator 533. In some embodiments, the orientation of source conversion unit 220 may be predetermined to an optimal value based on factors including, but are not limited to, the application, the desired analysis, the sample, objective lens excitation, landing energy of primary electron beamlets, among other things. In some embodiments, however, the orientation of source conversion unit 220 may be adjusted dynamically based on the collection efficiency of electron detectors, desired inspection throughput, the application, the desired analysis, the sample, among other things.

Figure 7B:
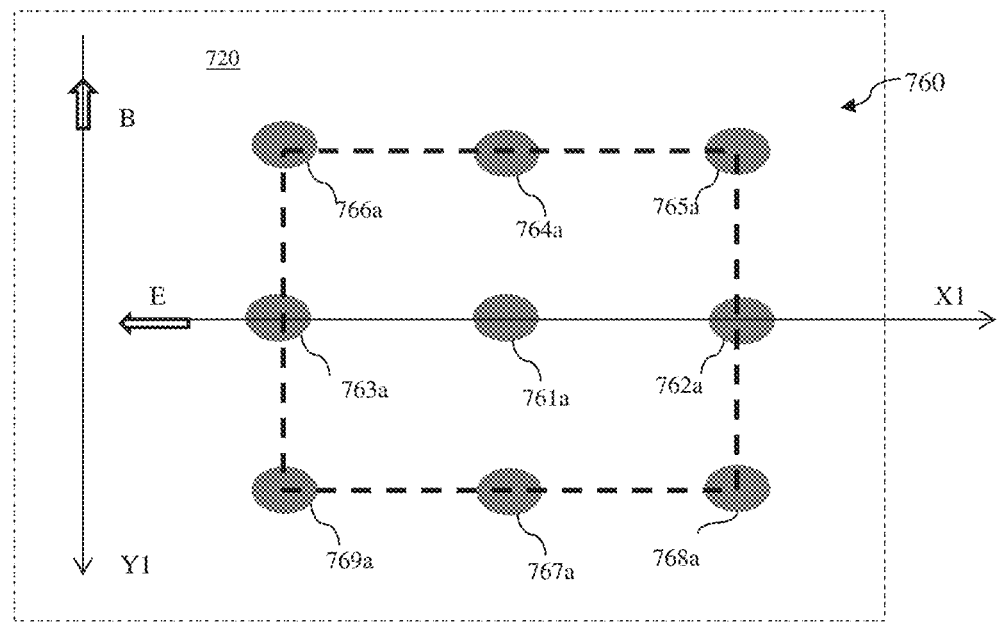

FIG. 7B illustrates an exiting secondary electron beam array 760 representing a projection of an array of exiting secondary electron beams 761a-769a on a plane 720 downstream of beam separator (e.g., beam separator 533 of FIG. 5), before entering secondary projection imaging system (e.g., secondary projection imaging system 550 of FIG. 5). In this context, exiting secondary electron beams 761a-769a may refer to secondary electron beams deflected by the beam separator such that they are directed towards the secondary projection imaging system. In some embodiments, exiting secondary electron beams 761a-769a after exiting beam separator may be non-circular in cross-section, as illustrated in FIG. 7B. For example, the cross-section of exiting secondary electron beams 361a-369a may comprise an oval, an elliptical, or a non-circular shape, based on the performance of the beam separator, among other things.

In some embodiments, exiting secondary electron beam array 760 may comprise a rectangular array (deformed array) of exiting secondary electron beams 761a-769a having non-circular cross-sections. One of several factors causing the variation of secondary electron beam cross-section and beam array deformation includes deflection performance of a beam separator (e.g., beam separator 533 of FIG. 5) as shown and explained in FIGS. 3A-3D, among other things.

Figure 8:
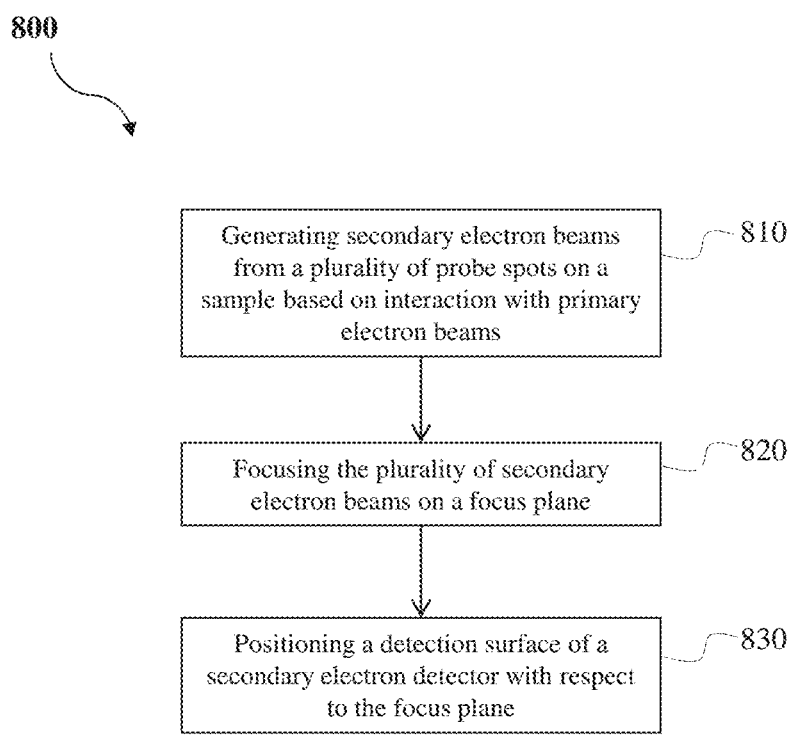
FIG. 8 is a process flowchart representing an exemplary method of forming an image of a sample using multiple beams in a multi-beam inspection system, consistent with embodiments of the present disclosure.

Reference is now made to FIG. 8, which illustrates a process flowchart representing an exemplary method 800 of forming an image of a sample using multiple beams in a multi-beam inspection system, consistent with embodiments of the present disclosure. Method 800 may be performed by controller 50 of EBI system 100, as shown in FIG. 1, for example. Controller 50 may be programmed to perform one or more blocks of method 800. For example, controller 50 may apply an electrical signal to a stigmator (e.g., stigmator 555 of FIG. 5) to adjust the quadrupole field thereof and compensate the astigmatism aberration of the secondary electron beams, and carry out other functions.

In step 810, a plurality of secondary electron beams may be generated from a sample (e.g., sample 208 of FIG. 2). A charged particle source (e.g., electron source 201 of FIG. 2) may be activated to generate a charged particle beam (e.g., primary electron beam 202 of FIG. 2). The electron source may be activated by a controller (e.g., controller 50 of FIG. 2). For example, the electron source may be controlled to emit primary electrons to form an electron beam along a primary optical axis (e.g., primary optical axis 204 of FIG. 2). The electron source may be activated remotely, for example, by using a software, an application, or a set of instructions for a processor of a controller to power the electron source through a control circuitry.

A plurality of primary electron beamlets (e.g., primary beamlets 211, 212, and 213 of FIG. 2) may be generated from the primary electron beam and focused on the sample using an objective lens (e.g., objective lens 231 of FIG. 2). The focused primary electron beamlets, upon interaction with the sample, may form a plurality of probe spots on the sample and generate a plurality of secondary electron beams (e.g., secondary electron beams 361-369 of FIG. 3C). The generated secondary electron beams may be directed towards a beam separator (e.g., beam separator 233 of FIG. 2) configured to deflect the secondary electron beams towards a secondary projection imaging system (e.g., secondary projection imaging system 250 of FIG. 2). The secondary electron beams entering the beam separator may be deflected to travel along a secondary optical axis (e.g., secondary optical axis 251 of FIG. 2) to form exiting secondary electron beams (e.g., modified secondary electron beams 361a-369a of FIG. 3).

The deflection of a secondary electron beam may be related to the position of the secondary electron beam with reference to the primary optical axis along which beam separator is placed, among other things. For example, off-axis secondary electron beams away from the center of X1-Y1-axes, may be deflected by a larger distance than an on-axis secondary electron beam.

In a multi-beam inspection apparatus, such as a multi-beam SEM, using a Wien filter (e.g., beam separator 333 of FIG. 3B) to separate primary electron beams from secondary electron beams may cause beam astigmatism aberration, and beam array deformation, among other things. The imaging resolution in a SEM may depend on, among other things, focus of the secondary electron beams incident on a detection element (e.g., detection element 241 of FIG. 2) of an electron detection device (e.g., electron detection device 240 of FIG. 2) such as a secondary electron detector, quality of the imaging signals received, collection efficiency and detection efficiency of electron detection devices. One of several factors impacting the focus of a secondary electron beam may be astigmatism aberration, which may cause beam profile distortion, or beam array deformation, among other things. A defocused electron beam may have a large incidence spot on a secondary electron detector. In conventional multi-beam SEMs, the defocused electron beam may be incident upon multiple detection elements of the secondary electron detector. In other words, each of the multiple detection elements may receive secondary electrons from a corresponding secondary electron beam and other adjacent beams. Consequently, the imaging signal of one detection element may comprise a main component originating from the corresponding secondary electron beam and a crosstalk component originating from adjacent electron beams. The occurrence of crosstalk may reduce the collection efficiency and the inspection throughput, among other things.

In some embodiments, a stigmator (e.g., stigmator 555 of FIG. 5) may be configured to compensate astigmatism aberration caused by the beam separator. One or more stigmators may be configured to apply a correcting magnetic or electric field to the secondary electron beams as the beams pass through the secondary projection imaging system. The magnetic or electric field experienced by the secondary electrons may be adjusted by adjusting the electrical excitation of stigmator. Adjusting the electrical excitation of stigmator may include, but is not limited to, adjusting a voltage or a coil current applied to one or more poles of the stigmator.

In some embodiments, adjusting the electrical excitation of the stigmator may comprise adjusting the profile of exiting secondary electron beams from a non-circular cross-section to a substantially circular cross-section.

In step 820, the plurality of secondary electron beams may be focused on a focus plane (e.g., final image plane SP2 of FIG. 5). The final image plane SP2 may comprise a focus plane of exiting secondary electron beams. The profile of focused exiting secondary electron beams may be substantially circular after exiting the stigmator. Final image plane SP2 may comprise a flat focus plane such that the exiting secondary electron beams are focused on the same flat focus plane. In practice, however, exiting secondary electron beams of a beam array may be focused on a curved focus plane comprising a plurality of flat focus planes. One of the several reasons for non-coplanar focus of modified secondary electron beams may include, but is not limited to, field curvature aberration.

Flat focus image plane SP2 may be non-perpendicular to the secondary optical axis, in part because virtual intermediate image plane SP1-R formed by the objective lens and beam separator is not perpendicular to the secondary optical axis, among other things. In conventional multi-beam inspection systems, an electron detector may be placed perpendicular to the secondary optical axis, while final image plane SP2 is non-perpendicular to secondary optical axis. Such a configuration may result in one or more exiting secondary electron beams to be defocused on detection surface (e.g., detection surface 540D of FIG. 5) of electron detection device, for example, and deformation of exiting secondary electron beam array on the detection surface in the direction of the tilt of final image plane SP2. The beam defocus and beam array deformation may cause a reduction in collection efficiency, an increase in crosstalk, and a reduction in throughput, among other things.

In step 830, the detection surface of the electron detection device may be positioned with respect to the focus plane. In some embodiments, the position of the electron detection device with respect to the focus plane may be adjusted. The electron detection device may be disposed along a detection plane. In some embodiments, the detection plane of electron detection device may form an angle α with final image plane SP2, as illustrated in FIG. 4A. Adjusting the position of electron detection device may comprise adjusting the angle α between the detection plane of electron detection device and final image plane SP2. Adjusting the angle α may comprise tilting electron detection device along one or more axes by a tilting angle to reduce the angle α between the detection plane of electron detection device and final image plane SP2. The angle α may be reduced such that the detection plane of electron detection device 540 and final image plane SP2 may coincide.

Figure 9:
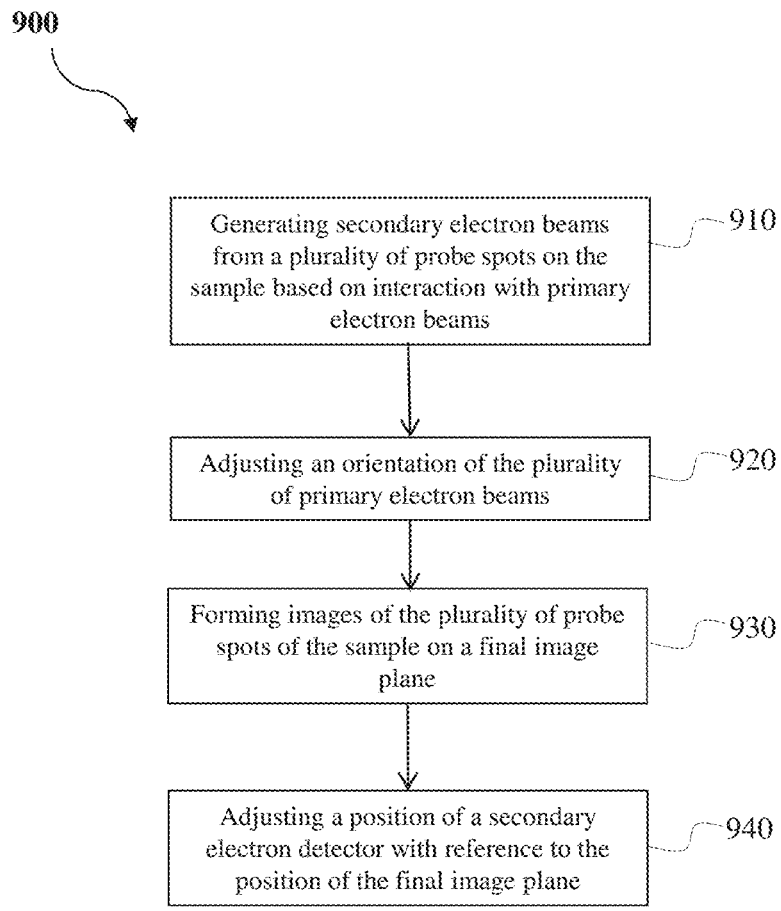
FIG. 9 is a process flowchart representing an exemplary method of forming images of a sample using multiple beams in a multi-beam inspection system, consistent with embodiments of the pre sent disclosure.

Reference is now made to FIG. 9, which illustrates a process flowchart representing an exemplary method 900 of forming an image of a sample using multiple beams in a multi-beam inspection system, consistent with embodiments of the present disclosure. Method 900 may be performed by controller 50 of EBI system 100, as shown in FIG. 1, for example. Controller 50 may be programmed to perform one or more blocks of method 900. For example, controller 50 may apply an electrical signal to a stigmator (e.g., stigmator 555 of FIG. 5) to adjust the electric or magnetic field and compensate the astigmatism aberration of the secondary electron beams, and carry out other functions.

In step 910, a plurality of primary electron beamlets (e.g., primary beamlets 211, 212, and 213 of FIG. 2) may be generated from a primary electron beam (e.g., primary electron beam 202 of FIG. 2) and focused on the sample using an objective lens (e.g., objective lens 231 of FIG. 2). The focused primary electron beamlets, upon interaction with the sample, may form a plurality of probe spots on the sample and generate a plurality of secondary electron beams (e.g., secondary electron beams 361-369 of FIG. 3C). The generated secondary electron beams may be directed towards a beam separator (e.g., beam separator 233 of FIG. 2) configured to deflect the secondary electron beams towards a secondary projection imaging system (e.g., secondary projection imaging system 250 of FIG. 2). The secondary electron beams entering the beam separator may be deflected along a secondary optical axis (e.g., secondary optical axis 251 of FIG. 2) to form exiting secondary electron beams (e.g., modified secondary electron beams 361a-369a of FIG. 3).

In step 920, an orientation of the primary electron beamlets may be adjusted such that the resulting secondary electron beams are aligned with the direction of deflection of the secondary electron beams by the beam separator. Adjusting the orientation of the primary electron beamlets may comprise rotating the primary electron beamlets around the primary optical axis such that the resultant secondary electron beams may be rotated correspondingly to form a secondary electron beam array aligned along the X1- and Y1-axes.

The angle of rotation of primary electron beamlets to cause formation of secondary electron beam array may be determined based on including, but is not limited to, the orientation of source conversion unit (e.g., source conversion unit 220 of FIG. 2), among other things. The orientation of source conversion unit to adjust the rotation of primary electron beamlets may be adjusted such that secondary electron beam array is aligned in the direction of deflection of secondary electron beams by the beam separator.

In some embodiments, a stigmator (e.g., stigmator 555 of FIG. 5) may be configured to compensate astigmatism aberration caused by the beam separator. One or more stigmators may be configured to apply a correcting magnetic or electric field to the secondary electron beams as the beams pass through the secondary projection imaging system. The magnetic or electric field experienced by the secondary electrons may be adjusted by adjusting the electrical excitation of stigmator. Adjusting the electrical excitation of stigmator may include, but is not limited to, adjusting a voltage or a coil current applied to one or more poles of the stigmator.

In step 930, an image of the plurality of probe spots of the sample may be formed on a final image plane (e.g., final image plane SP2 of FIG. 5). Final image plane SP2 may comprise a focus plane of exiting secondary electron beams. The profile of focused exiting secondary electron beams may be substantially circular after exiting the stigmator. Final image plane SP2 may comprise a flat focus plane such that the exiting secondary electron beams are focused on the same flat focus plane. In practice, however, exiting secondary electron beams of a beam array may be focused on a curved focus plane comprising a plurality of flat focus planes.

In step 940, a position of the electron detection device with reference to the position of the final image plane may be adjusted. The electron detection device may be disposed along a detection plane. In some embodiments, the detection plane of electron detection device may form an angle α with final image plane SP2, as illustrated in FIG. 4A. Adjusting the position of electron detection device may comprise adjusting the angle α between the detection plane of electron detection device and final image plane SP2. Adjusting the angle α may comprise tilting electron detection device along one or more axes by a tilting angle to reduce the angle α between the detection plane of electron detection device and final image plane SP2. The angle α may be reduced such that the detection plane of electron detection device 540 and final image plane SP2 may coincide.

A non-transitory computer readable medium may be provided that stores instructions for a processor of a controller (e.g., controller 50 of FIG. 1) to carry out image inspection, image acquisition, activating charged-particle source, adjusting electrical excitation of stigmators, adjusting landing energy of electrons, adjusting objective lens excitation, adjusting secondary electron detector position and orientation, stage motion control, beam separator excitation, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The embodiments may further be described using the following clauses:

1. A method performed by a multi-beam apparatus to form images of a sample, the method comprising:

generating a plurality of secondary electron beams from a plurality of probe spots on the sample along a primary-optical axis upon interaction with a plurality of primary electron beams;

focusing the plurality of secondary electron beams onto a focus plane; and positioning a detection surface of a secondary electron detector with respect to the focus plane.

2. The method of clause 1, wherein the plurality of secondary electron beams comprises an array of secondary electron beams.

3. The method of any one of clauses 1 and 2, further comprising adjusting an orientation of the plurality of primary electron beams interacting with the sample.

4. The method of clause 3, wherein adjusting the orientation of the plurality of primary electron beams adjusts an orientation of the array of secondary electron beams.

5. The method of any one of clauses 3 and 4, wherein adjusting the orientation of the plurality of primary electron beams comprises rotating the plurality of primary electron beams around the primary optical axis.

6. The method of any one of clauses 1-5, further comprising directing, using a beam separator, the plurality of secondary electron beams towards the secondary electron detector along a secondary optical axis.

7. The method of any one of clauses 1-6, further comprising adjusting an electrical excitation of a stigmator to compensate astigmatism aberration of the plurality of secondary electron beams.

8. The method of any one of clauses 1-7, wherein the secondary electron detector is disposed downstream of a secondary electron projection system configured to focus the plurality of secondary electron beams on the focus plane.

9. The method of clause 8, wherein the secondary electron detector comprises a plurality of detection elements, and wherein a detection element of the plurality of detection elements is associated with a corresponding secondary electron beam of the plurality of secondary electron beams.

10. The method of any one of clauses 8 and 9, wherein positioning the detection surface of the secondary electron detector comprises adjusting a tilting angle between the detection surface and the focus plane.

11. The method of clause 10, wherein adjusting the tilting angle comprises reducing the tilting angle between the detection surface of the secondary electron detector and the focus plane.

12. The method of clause 11, wherein reducing the tilting angle comprises adjusting the position of the secondary electron detector such that the detection surface of the secondary electron detector substantially coincides with the focus plane.

13. The method of clause 12, wherein adjusting the position of the secondary electron detector comprises dynamically adjusting the tilting angle based on a collection efficiency of the secondary electron detector.

14. The method of any one of clauses 12-13, wherein adjusting the position of the secondary electron detector comprises adjusting the tilting angle to a predetermined value of the tilting angle.

15. The method of any one of clauses 12-14, wherein adjusting the position of the secondary electron detector comprises adjusting the tilting angle in one or more planes with reference to the secondary optical axis.

16. A method performed by a multi charged-particle beam apparatus to form images of a sample, the method comprising:

generating a plurality of secondary electron beams from a plurality of probe spots on the sample along a primary optical axis upon interaction with a plurality of primary electron beams;

adjusting an orientation of the plurality of primary electron beams interacting with the sample;

forming images of the plurality of probe spots of the sample on a final image plane; and positioning a detection surface of a secondary electron detector with respect to a position of the final image plane.

17. The method of clause 16, wherein the plurality of secondary electron beams comprises an array of secondary electron beams.

18. The method of any one of clauses 16 and 17, wherein adjusting the orientation of the plurality of primary electron beams adjusts an orientation of the array of secondary electron beams.

19. The method of any one of clauses 16-18, wherein adjusting the orientation of the plurality of primary electron beams comprises rotating the plurality of primary electron beams around the primary optical axis.

20. The method of any one of clauses 16-19, further comprising directing, using a beam separator, the plurality of secondary electron beams towards the secondary electron detector along a secondary optical axis.

21. The method of any one of clauses 16-20, further comprising adjusting an electrical excitation of a stigmator to compensate astigmatism aberration of the plurality of secondary electron beams.

22. The method of any one of clauses 16-21, wherein the secondary electron detector is disposed downstream of a secondary electron projection system configured to form the images of the plurality of probe spots on the final image plane.

23. The method of clause 22, wherein the secondary electron detector comprises a plurality of detection elements, and wherein a detection element of the plurality of detection elements is associated with a corresponding secondary electron beam of the plurality of secondary electron beams.

24. The method of any one of clauses 22 and 23, wherein positioning the detection surface of the secondary electron detector comprises adjusting a tilting angle between a detection plane of the secondary electron detector and the final image plane.

25. The method of clause 24, wherein adjusting the tilting angle comprises reducing the tilting angle between the detection plane of the secondary electron detector and the final image plane.

26. The method of clause 25, wherein reducing the tilting angle comprises adjusting the position of the secondary electron detector such that the detection plane of the secondary electron detector substantially coincides with the final image plane.

27. The method of clause 26, wherein adjusting the position of the secondary electron detector comprises dynamically adjusting the tilting angle based on a collection efficiency of the secondary electron detector.

28. The method of any one of clauses 26-27, wherein adjusting the position of the secondary electron detector comprises adjusting the tilting angle to a predetermined value of the tilting angle.

29. The method of any one of clauses 24-28, wherein adjusting the position of the secondary electron detector comprises adjusting the tilting angle in one or more planes with reference to the secondary optical axis.

30. A multi-beam apparatus for inspecting a sample using a plurality of primary electron beams configured to form a plurality of probe spots on the sample, the multi-beam apparatus comprising:

a secondary electron projection system configured to:

receive a plurality of secondary electron beams resulting from the formation of the probe spots, and form images of the plurality of probe spots on the sample on a final image plane; and a secondary electron detector configured to detect the plurality of secondary electron beams, wherein a position of the charged-particle detector is set based on a position of the final image plane.

31. The multi-beam apparatus of clause 30, wherein the plurality of secondary electron beams comprises an array of secondary electron beams.

32. The multi-beam apparatus of any one of clauses 30-31, further comprising an objective lens configured to focus the plurality of primary electron beams on the sample and form images of the plurality of probe spots on an intermediate image plane along a primary optical axis.

33. The multi-beam apparatus of any one of clauses 30-32, further comprising a beam separator configured to direct the plurality of secondary electron beams towards the secondary electron detector along a secondary optical axis.

34. The multi-beam apparatus of any one of clauses 30-33, further comprising a stigmator configured to compensate astigmatism aberration of the plurality of secondary electron beams.

35. The multi-beam apparatus of any one of clauses 30-34, wherein the secondary electron detector is disposed downstream of the secondary electron projection system.

36. The multi-beam apparatus of any one of clauses 30-35, wherein the secondary electron detector comprises a plurality of detection elements, and wherein a detection element of the plurality of detection elements is associated with a corresponding secondary electron beam of the plurality of secondary electron beams.

37. The multi-beam apparatus of any one of clauses 30-36, wherein a setting of a position of the secondary electron detector comprises an adjusted tilting angle between a detection plane of the secondary electron detector and the final image plane.

38. The multi-beam apparatus of clause 37, wherein the setting of the position of the secondary electron detector comprises a reduced tilting angle between the detection plane and the final image plane.

39. The multi-beam apparatus of clause 38, wherein the reduced tilting angle comprises the setting of the position of the secondary electron detector such that the detection plane substantially coincides with the final image plane.

40. The multi-beam apparatus of any one of clauses 37-39, wherein the setting of the position of the secondary electron detector further comprises a dynamically adjusted tilting angle based on a collection efficiency of the secondary electron detector.

41. The multi-beam apparatus of any one of clauses 37-40, wherein the setting of the position of the secondary electron detector further comprises a predetermined value of the tilting angle.

42. The multi-beam apparatus of any one of clauses 30-41, wherein the final image plane comprises a curved plane.

43. A multi-beam apparatus, comprising:

a secondary electron projection system comprising a stigmator configured to influence paths of a plurality of secondary electron beams generated from a plurality of probe spots on a sample; and a secondary electron detector configured to detect the plurality of secondary electron beams, wherein a position of the secondary electron detector is determined based on a position of a final image plane of the plurality of probe spots.

44. The apparatus of clause 43, wherein the secondary electron projection system is configured to focus the plurality of secondary electron beams and form the final image plane.

45. The apparatus of any one of clauses 43 and 44, wherein the stigmator comprises an electric or a magnetic multi-pole lens.

46. The apparatus of any one of clauses 43-45, wherein an adjustment of an electrical excitation of the stigmator compensates astigmatism aberration of the plurality of secondary electron beams.

47. The apparatus of any one of clauses 43-46, further comprising an objective lens configured to:

focus a plurality of primary electron beams to form the plurality of probe spots on the sample; and form images of the plurality of probe spots on an intermediate image plane substantially perpendicular to a primary optical axis.

48. The apparatus of any one of clauses 43-47, further comprising a beam separator configured to direct the plurality of secondary electron beams towards the secondary electron detector along a secondary optical axis.

49. The apparatus of any one of clauses 43-48, wherein the secondary electron detector is disposed downstream of the secondary electron projection system.

50. The apparatus of clause 49, wherein the secondary electron detector comprises a plurality of detection elements, and wherein a detection element of the plurality of detection elements is associated with a corresponding secondary electron beam of the plurality of secondary electron beams.

51. The apparatus of any one of clauses 49 and 50, wherein an adjustment of the position of the secondary electron detector comprises adjustment of a tilting angle between a detection plane of the secondary electron detector and the final image plane.

52. The apparatus of clause 51, wherein the adjustment of the position of the secondary electron detector comprises a reduction of the tilting angle between the detection plane and the final image plane.

53. The apparatus of clause 52, wherein the reduction of the tilting angle comprises adjustment of the position of the secondary electron detector such that the detection plane substantially coincides with the final image plane.

54. The apparatus of any one of clauses 51-53, wherein the adjustment of the position of the secondary electron detector further comprises a dynamic adjustment of the tilting angle based on a detection efficiency of the plurality of secondary electron beams of the secondary electron detector.

55. The apparatus of any one of clauses 51-54, wherein the adjustment of the position of the secondary electron detector further comprises setting the tilting angle to a predetermined value.

56. A non-transitory computer readable medium storing a set of instructions that is executable by one or more processors of a multi-beam apparatus to cause the multi-beam apparatus to perform a method of forming images of a sample, the method comprising:

generating a plurality of secondary electron beams from a plurality of probe spots of a plurality of primary electron beams on the sample along a primary-optical axis;

acquiring images of the plurality of probe spots of the sample on a final image plane using a secondary electron detector; and positioning a detection surface of the secondary electron detector based on a position of the final image plane.

57. The non-transitory computer readable medium of clause 56, wherein the set of instructions that is executable by one or more processors of the multi-beam apparatus causes the multi-beam apparatus to further perform:

forming, using an objective lens, an intermediate image of the plurality of probe spots on an intermediate image plane substantially perpendicular to a primary optical axis; and directing, using a beam separator, the plurality of secondary electron beams towards the secondary electron detector along a secondary optical axis.

58. The non-transitory computer readable medium of clause 57, wherein the set of instructions that is executable by one or more processors of the multi-beam apparatus causes the multi-beam apparatus to further perform:

adjusting an orientation of the plurality of primary electron beams interacting with the sample, wherein adjusting the orientation of the plurality of primary electron beams comprises rotating the plurality of primary electron beams around the primary optical axis; and adjusting a tilting angle between a detection plane of the charged-particle detector and the final image plane.

59. The non-transitory computer readable medium of clause 58, wherein the set of instructions that is executable by one or more processors of the multi-beam apparatus causes the multi-beam apparatus to further perform adjusting an electrical excitation of a stigmator to compensate astigmatism aberration of the plurality of secondary electron beams.

The descriptions above are intended to be illustrative, not limiting. Thus, it will be apparent to one skilled in the art that modifications may be made as described without departing from the scope of the claims set out below.

The invention claimed is:

1. A method performed by a multi-beam apparatus to form images of a sample, the method comprising:
    generating a plurality of secondary electron beams from a plurality of probe spots on the sample along a primary-optical axis upon interaction with a plurality of primary electron beams;
    focusing the plurality of secondary electron beams onto a focus plane; and
    positioning a detection surface of a secondary electron detector with respect to the focus plane.

2. The method of claim 1, further comprising adjusting an electrical excitation of a stigmator to compensate astigmatism aberration of the plurality of secondary electron beams.

3. A multi-beam apparatus for inspecting a sample using a plurality of primary electron beams configured to form a plurality of probe spots on the sample, the multi-beam apparatus comprising:
    a secondary electron projection system configured to:
        receive a plurality of secondary electron beams resulting from the formation of the probe spots, and form images of the plurality of probe spots on the sample on a final image plane; and
    a secondary electron detector configured to detect the plurality of secondary electron beams, wherein a position of the secondary electron detector is set based on a position of the final image plane.

4. The multi-beam apparatus of claim 3, wherein the plurality of secondary electron beams comprises an array of secondary electron beams.

5. The multi-beam apparatus of claim 3, further comprising an objective lens configured to focus the plurality of primary electron beams on the sample and form images of the plurality of probe spots on an intermediate image plane along a primary optical axis.

6. The multi-beam apparatus of claim 3, further comprising a beam separator configured to direct the plurality of secondary electron beams towards the secondary electron detector along a secondary optical axis.

7. The multi-beam apparatus of claim 3, further comprising a stigmator configured to compensate astigmatism aberration of the plurality of secondary electron beams.

8. The multi-beam apparatus of claim 3, wherein the secondary electron detector is disposed downstream of the secondary electron projection system.

9. The multi-beam apparatus of claim 3, wherein the secondary electron detector comprises a plurality of detection elements, and wherein a detection element of the plurality of detection elements is associated with a corresponding secondary electron beam of the plurality of secondary electron beams.

10. The multi-beam apparatus of claim 3, wherein a setting of a position of the secondary electron detector comprises an adjusted tilting angle between a detection plane of the secondary electron detector and the final image plane.

11. The multi-beam apparatus of claim 10, wherein the setting of the position of the secondary electron detector comprises a reduced tilting angle between the detection plane and the final image plane.

12. The multi-beam apparatus of claim 11, wherein the reduced tilting angle comprises the setting of the position of the secondary electron detector such that the detection plane substantially coincides with the final image plane.

13. The multi-beam apparatus of claim 10, wherein the setting of the position of the secondary electron detector further comprises a dynamically adjusted tilting angle based on a collection efficiency of the secondary electron detector.

14. The multi-beam apparatus of claim 10, wherein the setting of the position of the secondary electron detector further comprises a predetermined value of the tilting angle.

15. The multi-beam apparatus of claim 3, wherein the final image plane comprises a curved plane.

16. The multi-beam apparatus of claim 13, wherein the tilting angle of the secondary electron detector is adjusted during the inspection of the sample.

17. The multi-beam apparatus of claim 14, wherein the position of the secondary electron detector is adjusted to the predetermined value prior to the inspection of the sample.

* * * * *